United States Patent [19]

Satoh et al.

[11] Patent Number: 5,300,902
[45] Date of Patent: Apr. 5, 1994

[54] SURFACE ACOUSTIC WAVE DEVICE FOR BAND-PASS FILTER HAVING SMALL INSERTION LOSS AND PREDETERMINED PASS-BAND CHARACTERISTICS FOR BROAD BAND

[75] Inventors: Yoshio Satoh; Tsutomu Miyashita; Osamu Ikata; Mitsuo Takamatsu; Takashi Matsuda, all of Kawasaki, Japan

[73] Assignee: Fujitsu Limited, Kawasaki, Japan

[21] Appl. No.: 850,835

[22] Filed: Mar. 13, 1992

[30] Foreign Application Priority Data

Mar. 29, 1991 [JP] Japan .................. 3-066119
Aug. 28, 1991 [JP] Japan .................. 3-217432

[51] Int. Cl.$^5$ .................................... H03H 9/64
[52] U.S. Cl. ............................ 333/193; 333/195; 310/313 R
[58] Field of Search ............. 333/193, 195, 194; 310/313 R, 313 B, 313 C, 313 D

[56] References Cited

U.S. PATENT DOCUMENTS

| | | | |
|---|---|---|---|
| 4,468,642 | 8/1984 | Hikita | 333/193 |
| 4,492,940 | 1/1985 | Hikita | 333/195 X |
| 4,939,487 | 7/1990 | Yuhara et al. | 310/313 B X |
| 5,087,901 | 2/1992 | Kurosawa et al. | 333/196 X |
| 5,130,681 | 7/1992 | Ohnuki et al. | 310/313 D X |

FOREIGN PATENT DOCUMENTS 60-59809  4/1985  Japan .
231417    9/1989  Japan ..................... 333/193
2-202710  8/1990  Japan .
3-270309  12/1991 Japan .

OTHER PUBLICATIONS

M. Hikita et al., "High performance SAW filters with several new technologies for cellular radio," IEEE 1984 Ultrasonics Symposium, vol. 1, Nov. 16, 1984, Dallas, Tex., pp. 82–92.
M. Lewis "SAW Filters Employing Interdigitated Interdigital Transducers, IIDT" Ultrasonics Symposium Proceedings, circa 1982 (pp. 12–17).
M. Hikita et al. "800 MHz Low Loss SAW Filter". Institute of Electronics, Information and Communication Engineerings of Japan Technical Study Report, US81-22 (pp. 25–31), circa 1981.
M. Sakamoto et al. "Surface Acoustic Wave (SAW) Filter" Electronics Material, May, 1988, (pp. 120–124).

Primary Examiner—Robert J. Pascal
Assistant Examiner—Benny Lee
Attorney, Agent, or Firm—Staas & Halsey

[57] ABSTRACT

A surface acoustic wave device comprises a pair of multiple-electrode surface acoustic wave elements that are mirror-symmetrically arranged and disposed on a piezoelectric substrate. Each of the multiple-electrode surface acoustic wave elements comprises a plurality of input/output inter-digital transducers and connected inter-digital transducers. The number of the input/output inter-digital transducers is equal to or smaller by one, than the number of the connected inter-digital transducers, so that insertion loss of the surface acoustic wave device can be reduced without increasing the size of the device.

7 Claims, 22 Drawing Sheets

[NA(NA') = NB(NB') - 1]

SURFACE ACOUSTIC WAVE DEVICE FOR BAND-PASS FILTER HAVING SMALL INSERTION LOSS AND PREDETERMINED PASS-BAND CHARACTERISTICS FOR BROAD BAND

BACKGROUND OF THE INVENTION

1. Field of the Invention

The present invention relates to a surface acoustic wave device, more particularly, to a surface acoustic wave device used as a band-pass filter, etc., of mobile radio equipment, and the like.

2. Description of the Related Art

Recently, surface acoustic wave devices (which may be abbreviated hereinafter as SAW devices) have been developed and provided for RF circuit integrations of communication equipment such as mobile telephone transceivers, cable TV repeaters and converters, and the like.

The SAW device comprises a piezoelectric substrate and inter-digital transducers (which may be abbreviated hereinafter as IDTs) disposed thereon for converting a voltage into a surface acoustic wave, or a surface acoustic wave into a voltage. Note, the SAW device including IDTs converts a high-frequency voltage into a surface acoustic wave having a wavelength of about $10^{-5}$ times. The wave is propagated on the surface of the piezoelectric substrate and again converted into a voltage by the IDTs.

The SAW device provides a filter function for selecting frequencies by the above described double conversion and depending on the shapes of the IDTs. Note, the SAW device can cause the surface acoustic waves to resonate by using a plurality of the IDTs, or reflectors for reflecting surface acoustic waves beside the IDTs. Namely, the SAW device may provide a resonator function. Since the SAW device can delay propagation speed to about $10^{-5}$ times the speed of an electromagnetic wave, it may serve as a delay device.

These functions of the SAW devices are applicable for realizing filters, resonators, delay lines, etc., which are compact, inexpensive, and adjustment free. For example, they are used for intermediate frequency (IF) filters, resonators of oscillators, voltage control oscillators (VCOs), etc. These days, the SAW devices are operated at higher frequencies, and because they are compact and inexpensive, they are also used for band-pass filters for mobile radio equipment such as automobile and portable telephone equipment. Therefore, the SAW devices are required to have a small insertion loss and predetermined pass-band characteristics over a broad bandwidth.

SUMMARY OF THE INVENTION

An object of the present invention is to provide a surface acoustic wave device to suppress ripples and realize predetermined pass-band characteristics for a broad band. Further, another object of the present invention is to provide a surface acoustic wave device to reduce the insertion loss thereof.

According to the present invention, there is provided a surface acoustic wave device comprising: an input terminal; an output terminal; a first multiple-electrode surface acoustic wave element including a plurality of first inter-digital transducers and second inter-digital transducers alternating with each other, and the first inter-digital transducers being connected to the input terminal; and a second multiple-electrode surface acoustic wave element including a plurality of third inter-digital transducers and fourth inter-digital transducers alternating with each other, the first and second multiple-electrode surface acoustic wave elements being mirror-symmetrically arranged and disposed on a piezoelectric substrate, the third inter-digital transducers being connected to the output terminal, and the fourth inter-digital transducers being connected to the second inter-digital transducers; wherein the number of the first or third inter-digital transducers is equal to or smaller by one, than the number of the second or fourth inter-digital transducers.

The surface acoustic wave device may further comprise at least one reflector for reflecting surface acoustic waves being disposed outwardly from the outermost of the first and third inter-digital transducer; a center distance d between the first and second inter-digital transducers or the third and fourth inter-digital transducers being determined to be $d=(n+\beta)\cdot\lambda$, where, $\lambda$ being intervals of teeth of each inter-digital transducer, n being an optional integer, and $\beta$ ranging from 0.17 to 0.25; and a center distance d' between the reflector and the outermost of the first and third inter-digital transducer is determined to be $d'=n\cdot\lambda$ or $d'=(n+\frac{1}{2})\cdot\lambda$. The reflector may be constituted by a inter-digital transducers or strip electrodes.

The surface acoustic wave device may further comprise at least one fifth inter-digital transducers disposed outwardly from the Outermost second inter-digital transducers, and at least one sixth inter-digital transducers disposed outwardly from the outermost fourth inter-digital transducers; a center distance between the fifth or sixth inter-digital transducer and the second or fourth inter-digital transducer is determined to be $d'=n\cdot\lambda$ or $d'=(n+\frac{1}{2})\cdot\lambda$. The fifth inter-digital transducer and the sixth inter-digital transducer may be connected to each other to form connected electrodes.

BRIEF DESCRIPTION OF THE DRAWINGS

The present invention will be more clearly understood from the description of the preferred embodiments as set forth below with reference to the accompanying drawings, wherein.

DESCRIPTION OF THE PREFERRED EMBODIMENTS

For a better understanding of the preferred embodiments, first, the problems of the prior art will be explained, with reference to FIGS. 1 to 4.

Figure 1:
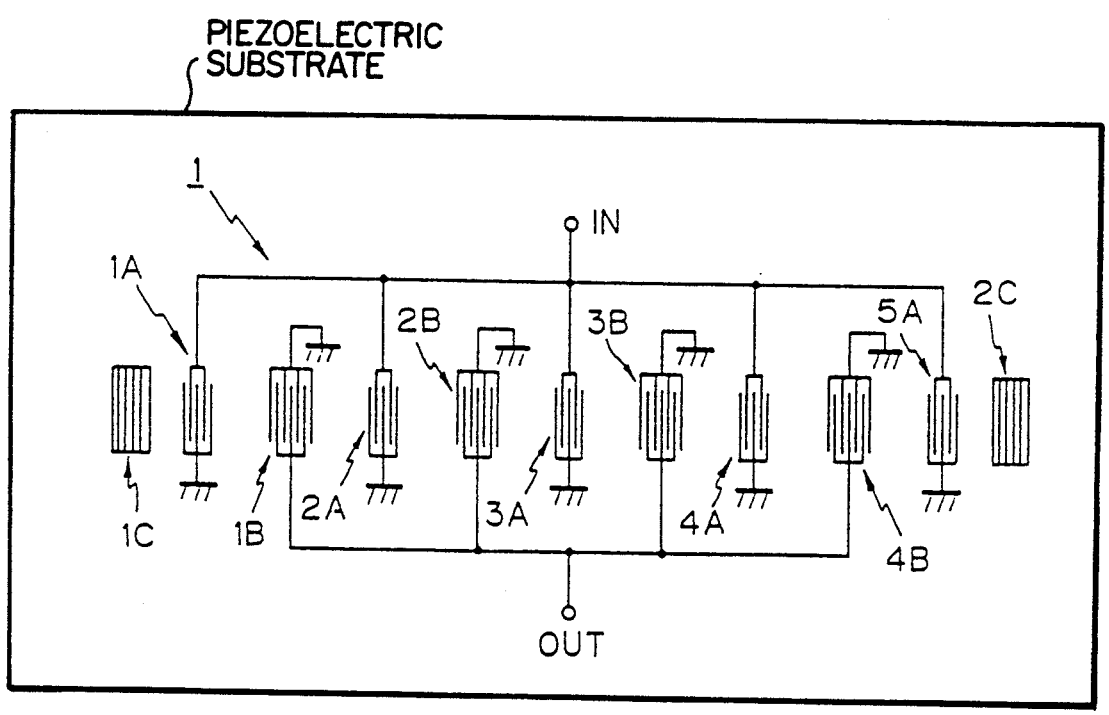
FIG. 1 is a view showing an example of an electrode configuration of a SAW device according to the prior art.
Figure 2:
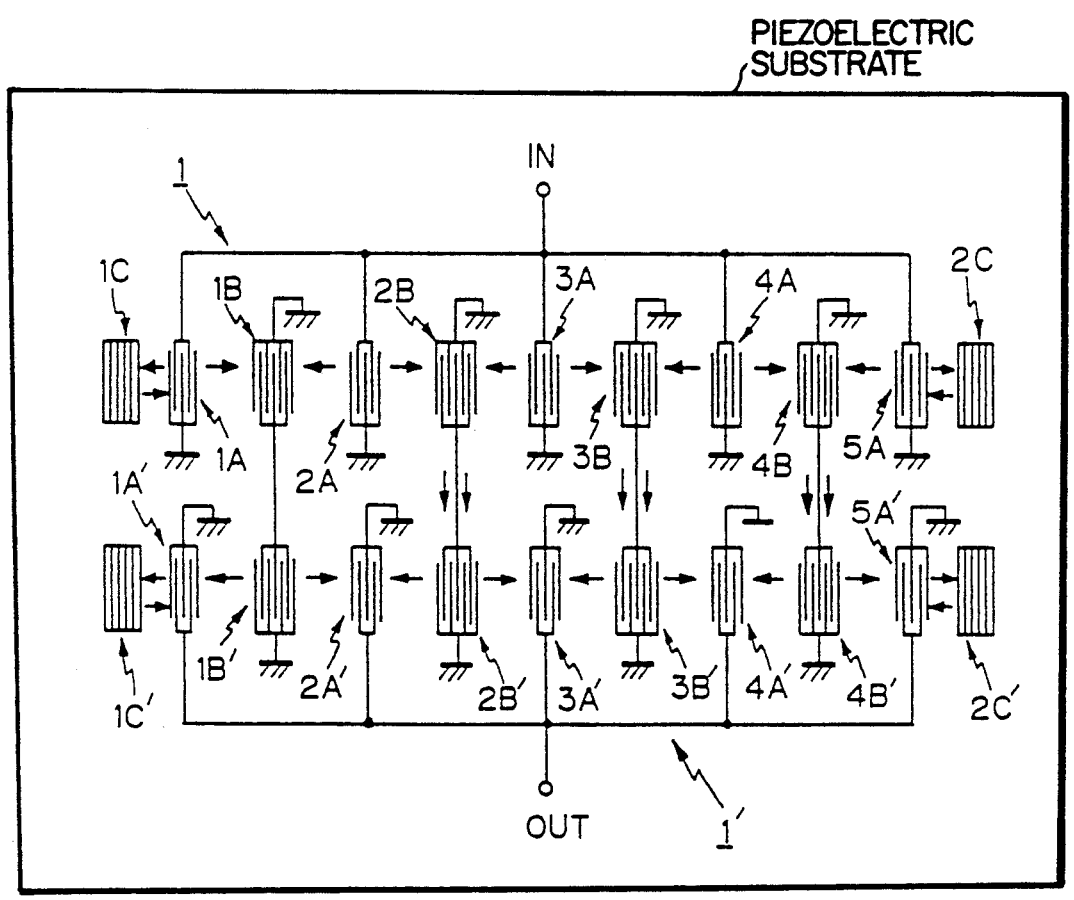
FIG. 2 is a view showing another example of an electrode configuration of a SAW device according to the prior art.

FIG. 1 shows an example of an electrode configuration of a SAW device (surface acoustic wave device) according to the prior art, and FIG. 2 shows another example thereof. Note, the SAW device of FIG. 1 is an example of a multiple-electrode configuration (with reference to "SAW Filters Employing Interdigitated Interdigital Transducers, IIDT", M. Lewis, 1982, Ultrasonics Symposium Proceedings, p. 12), and the SAW device of FIG. 2 is an example of a cascaded multiple-electrode configuration (with reference to Institute of Electronics, Information and Communication Engineers of Japan, Technical Study Report, US81-22, p. 25, or "High Performance SAW Filters with Several New Technologies for Cellular Radio", M. Hikita et al., 1984, Ultrasonics Symposium Proceedings, p. 82).

In FIGS. 1 and 2, IDTs (inter-digital transducers, or comb shaped electrodes) are of a so-called normalized type, and the numbers of meshing inter-digital transducer teeth pairs are not precise.

In FIG. 1, references 1A, 2A, 3A, 4A, 5A denote IDTs each having a smaller number of meshing electrode teeth pairs, and 1B, 2B, 3B, 4B denote IDTs each having a larger number of meshing electrode teeth pairs. As shown in FIG. 1, five electrodes 1A to 5A and four electrodes 1B to 4B are alternately arranged to provide nine electrodes in total with five inputs and four outputs. At each side of a row of the electrodes, there is arranged a reflector 1C, 2C such as a short strip reflector. Note, the electrodes 1A to 5A are connected to an input terminal IN, and the electrodes 1B to 4B are connected to an output terminal OUT, thereby forming a multiple-electrode SAW device 1, e.g., a multiple-electrode surface acoustic wave filter.

As shown in FIG. 2, the multiple-electrode SAW device (SAW element) 1 comprising five inputs and four outputs and a multiple-electrode SAW device (SAW element) 1' identical to the device 1 are mirror-symmetrically arranged. Note, opposing IDTs 1B, 2B, 3B, 4B of the SAW device 1 and opposing IDTs 1B', 2B', 3B', 4B' of the SAW device 1' are connected to each other. Further, the IDTs 1A, 2A, 3A, 4A, 5A of, for example, the multiple-electrode SAW device 1 serve as an input end (IN), and the IDTs 1A', 2A', 3A', 4A', 5A' of the other SAW device 1' serve as an output end (OUT). Namely, the SAW devices (SAW) elements) 1 and 1' are cascaded to form a multiple-electrode SAW device. The SAW elements 1 and 1' include reflectors 1C, 2C and 1C', 2C', respectively, arranged at each side of a row of electrodes.

In FIG. 2, arrows denote directions of surface acoustic waves converted from electric signals by the IDTs, or electric signals converted from surface acoustic waves.

Figure 3:
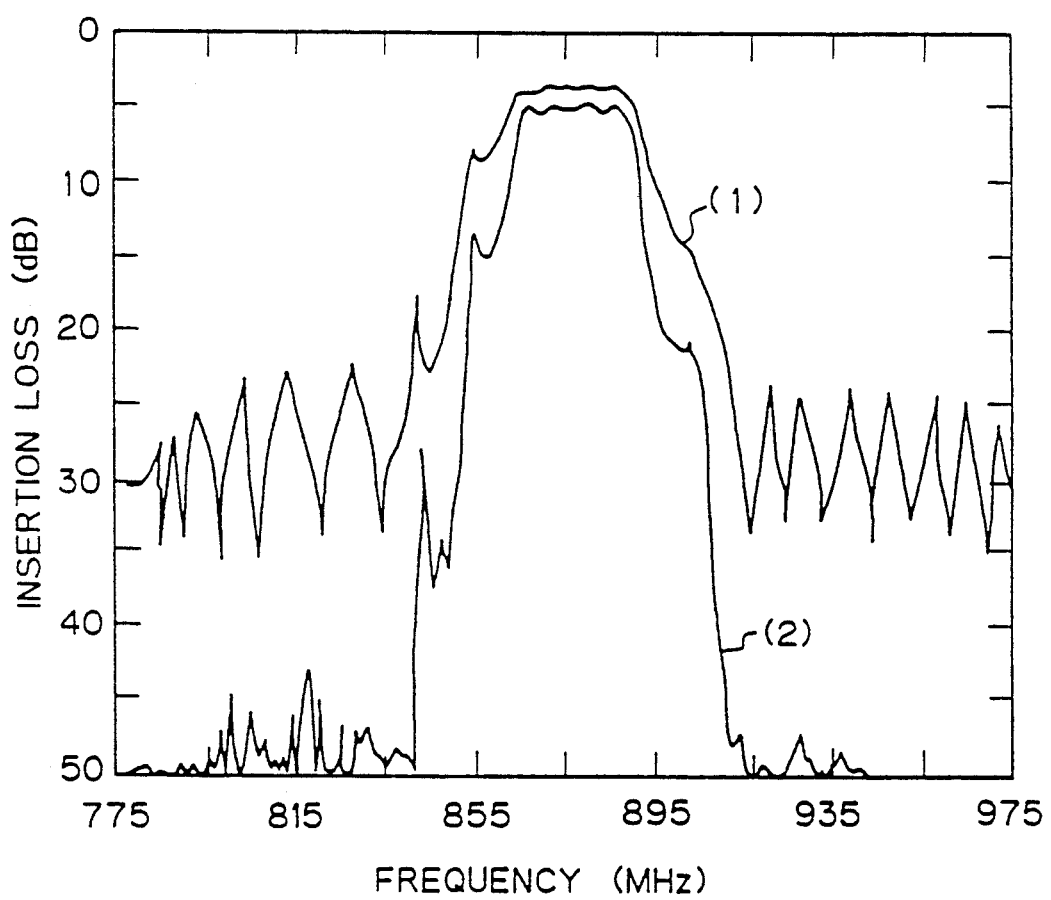
FIG. 3 is a view showing band characteristics of the SAW devices shown in FIGS. 1 and 2.

FIG. 3 shows band characteristics of the SAW devices shown in FIGS. 1 and 2. In FIG. 3, an ordinate represents insertion loss (dB) and an abscissa represents a frequency (MHz). Note, the samples shown are based on a multistage electrode arrangement of normalized 7-input 6-output type, formed on a 36° Y-X LiTaO$_3$ substrate. Further, an A-electrode (input/output electrode: 1A, 2A, ...) is constituted by 22-pair electrodes (split-fingers), a B-electrode (connected electrodes: 1B, 2B, ...) is constituted by 30-pair electrodes (split-fingers), and a reflector (1C, 2C, ...) is determined as 30-pair short strip type reflector.

In FIG. 3, reference numeral (1) represents the characteristics of the multiple-electrode configuration of FIG. 1, and (2) represents those of the cascaded multiple-electrode configuration of FIG. 2.

The multiple-electrode configuration partly shows insufficient attenuation in a blocking zone. On the other hand, the cascaded multiple-electrode configuration shows excellent attenuation in the blocking zone, thereby providing the surface acoustic wave filter with excellent blocking characteristics.

In the conventional multistage SAW devices, the cascaded multiple-electrode configuration may greatly improve the attenuation characteristics in the blocking zone, but increase insertion loss to 6 dB or more in a pass-band to exceed an allowable range of, for example, automobile and portable telephone sets that require a low loss (for example, 4 to 5 dB).

Figure 4:
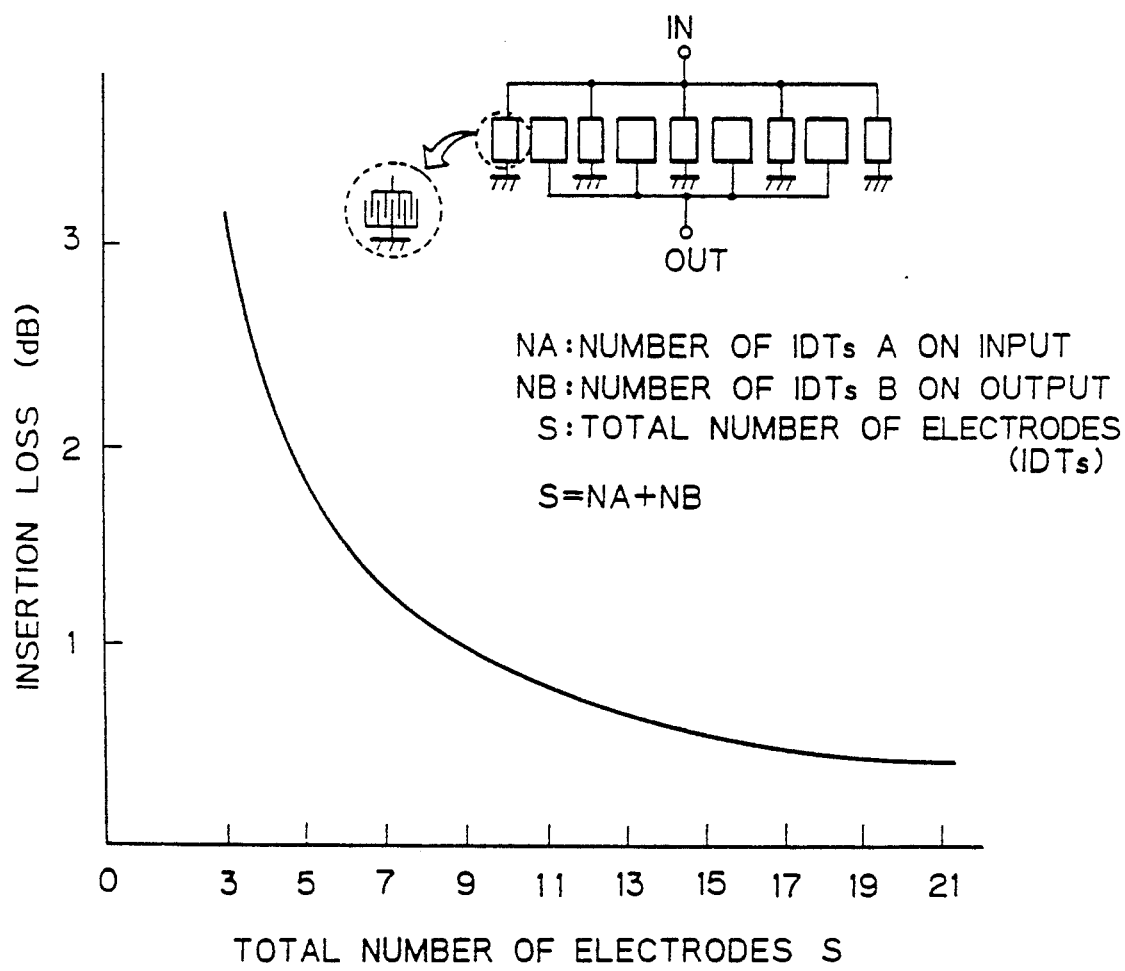
FIG. 4 is a view showing a relationship between the total number of electrodes and insertion loss thereof.

FIG. 4 shows a relationship between the total number of electrodes and insertion loss thereof. In FIG. 4, an ordinate represents the insertion loss, and an abscissa represents the total number of electrodes. Values shown have been calculated with no regard to surface acoustic wave propagation loss on a piezoelectric substrate nor to a IDT resistance loss.

When increasing the total number (S) of electrodes S=NA+NB, the insertion loss is decreased. Note, the reference NA denotes the number of IDTs A (A-electrodes) on the input side, and NB denotes the number of IDTs B (B-electrodes) on the output side of the multiple-electrode configuration. As shown in FIG. 4, approximately at S=13 with 7 inputs and 6 outputs, a decrease in the insertion loss becomes flat. Namely, when the total number S of electrodes is larger than 13, the insertion loss does not decrease significantly. On the other hand, when increasing the total number S of electrodes, the size of the substrate continues to increase. Accordingly, increasing the total number S of electrodes alone does not effectively decrease the insertion loss in practical use. This problem must be solved.

The preferred embodiments of a SAW device according to the present invention will be explained as follows, with reference to the accompanying drawings.

Figure 5:
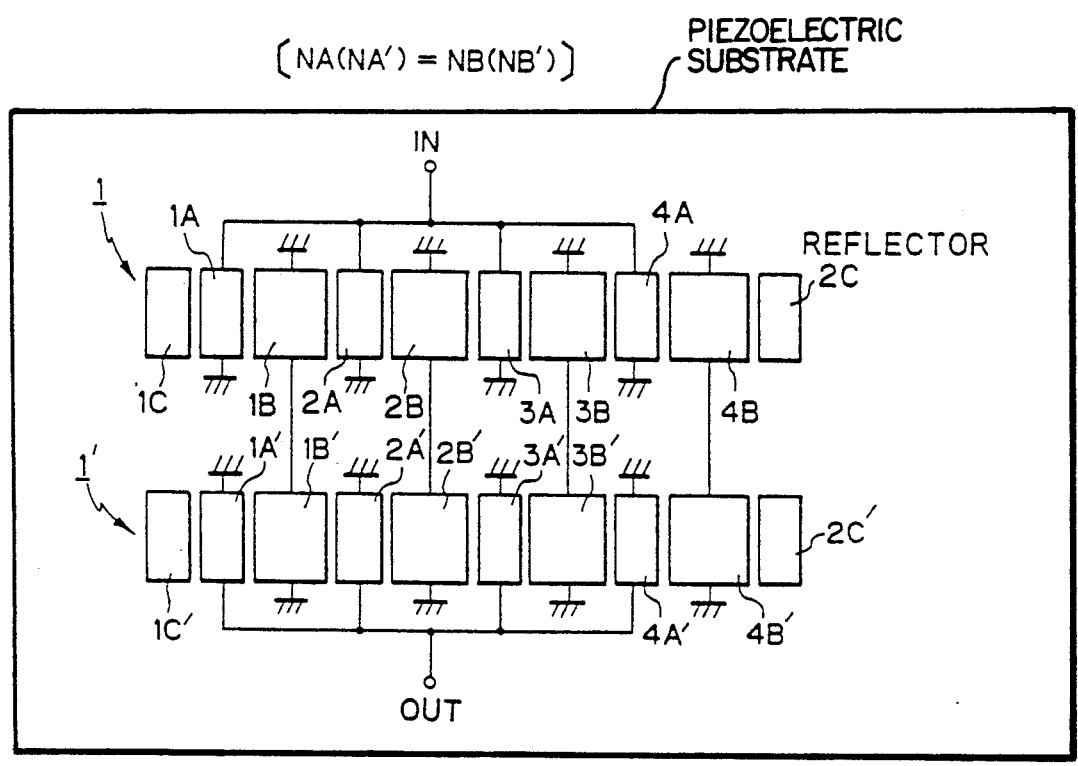
FIG. 5 is a view showing an electrode configuration of a first embodiment of a SAW device according to the present invention.
Figure 6:
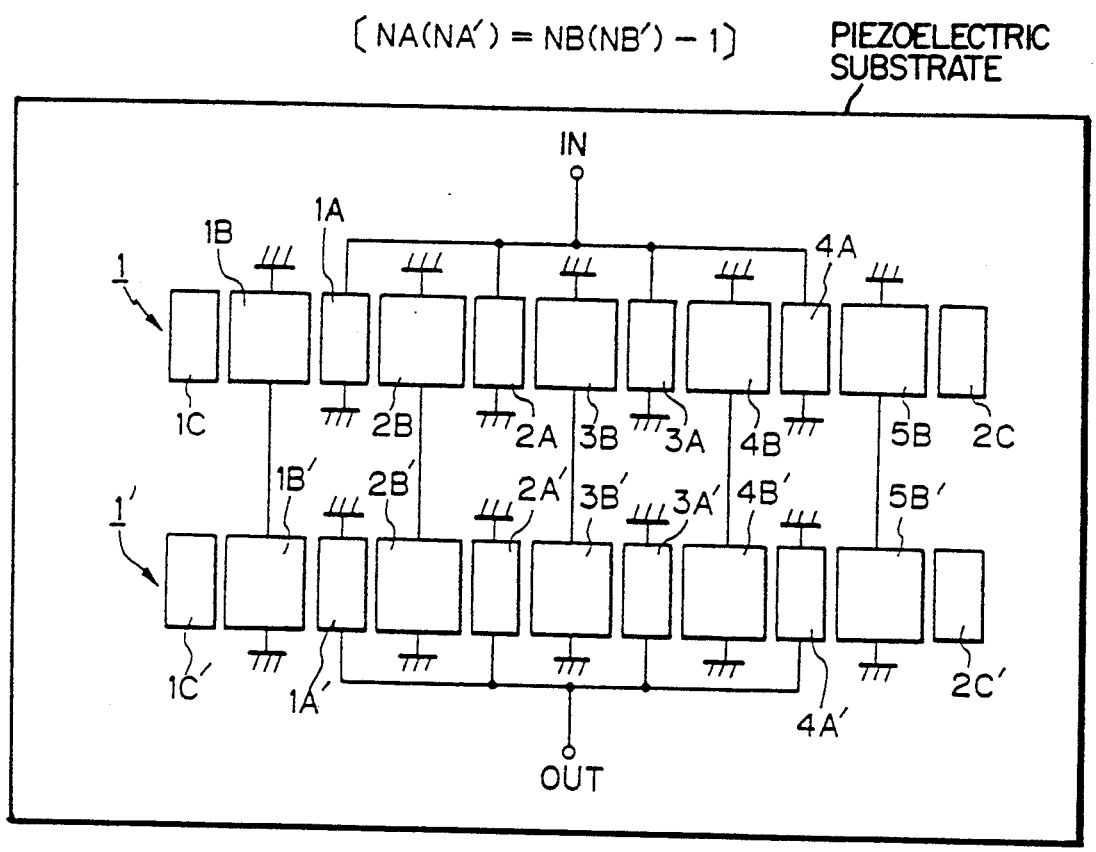
FIG. 6 is a view showing an electrode configuration of the modification of the SAW device shown in FIG. 5.

FIG. 5 shows an electrode configuration of a first embodiment of a SAW device (surface acoustic wave device) according to the present invention, and FIG. 6 shows an electrode configuration of the modification of the SAW device shown in FIG. 5. Note, in FIG. 5, the number of IDTs (inter-digital transducers) A at the input (NA) is equal to the number of IDTs B at the output (NB), i.e., NA=NB; and in FIG. 6, the number of IDTs A at the input (NA) is equal to the number of IDTs B at the output (NB) minus one, i.e., NA=NB−1. Further, references NA' and NB' represent the numbers of IDTs A and B of another (1') of the multiple-electrode surface acoustic wave elements that are mirror-symmetrically arranged. In addition, NA=NA' and NB=NB'.

In FIGS. 5 and 6, only the configuration of the electrodes are described, and the piezoelectric substrate and the like are not shown. In FIGS. 5 and 6, reference numerals 1 and 1' denote a pair of multiple-electrode surface acoustic wave elements (SAW elements) that are mirror-symmetrically arranged. The input/output IDTs A are connected to input terminal IN and output terminal OUT, and opposing connected IDTs B of the two elements are connected to each other. Note, references 1C, 2C, 1C', and 2C' denote reflectors.

As shown in FIG. 5, in the case of NA=NA'=NB=NB'=4 (a 4-input 4-output configuration), the SAW element 1 comprises four input/output electrodes (IDTs) 1A, 2A, 3A, 4A and four connected electrodes (IDTs) 1B, 2B, 3B, 4B, and the SAW element 1' comprises four input/output electrodes 1A', 2A', 3A', 4A' and four connected electrodes 1B', 2B', 3B', 4B'.

On the other hand, as shown in FIG. 6, in the case of NA=NA'=NB−1=NB'−1=4 (a 4-input 5-output configuration), the SAW element 1 comprises four input/output electrodes (input IDTs) 1A, 2A, 3A, 4A and five connected electrodes (connected IDTs) 1B, 2B, 3B, 4B, 5B, and the SAW element 1' comprises four input/output electrodes (output IDTs) 1A', 2A', 3A', 4A' and five connected electrodes (connected IDTs) 1B', 2B', 3B', 4B', 5B'. Note, the IDT (input/output electrode or connected electrode) is constituted by a plurality of pair electrodes (split-fingers), which will be explained in detail with reference to FIG. 11.

In addition to the input/output and connected electrodes previously described, the SAW elements 1 and 1' include reflectors 1C, 2C and 1C', 2C', respectively. Also, input terminal IN is connected to the input electrodes 1A, 2A, 3A, 4A and output terminal OUT is connected to output electrodes 1A', 2A', 3A', 4A'.

Figure 7:
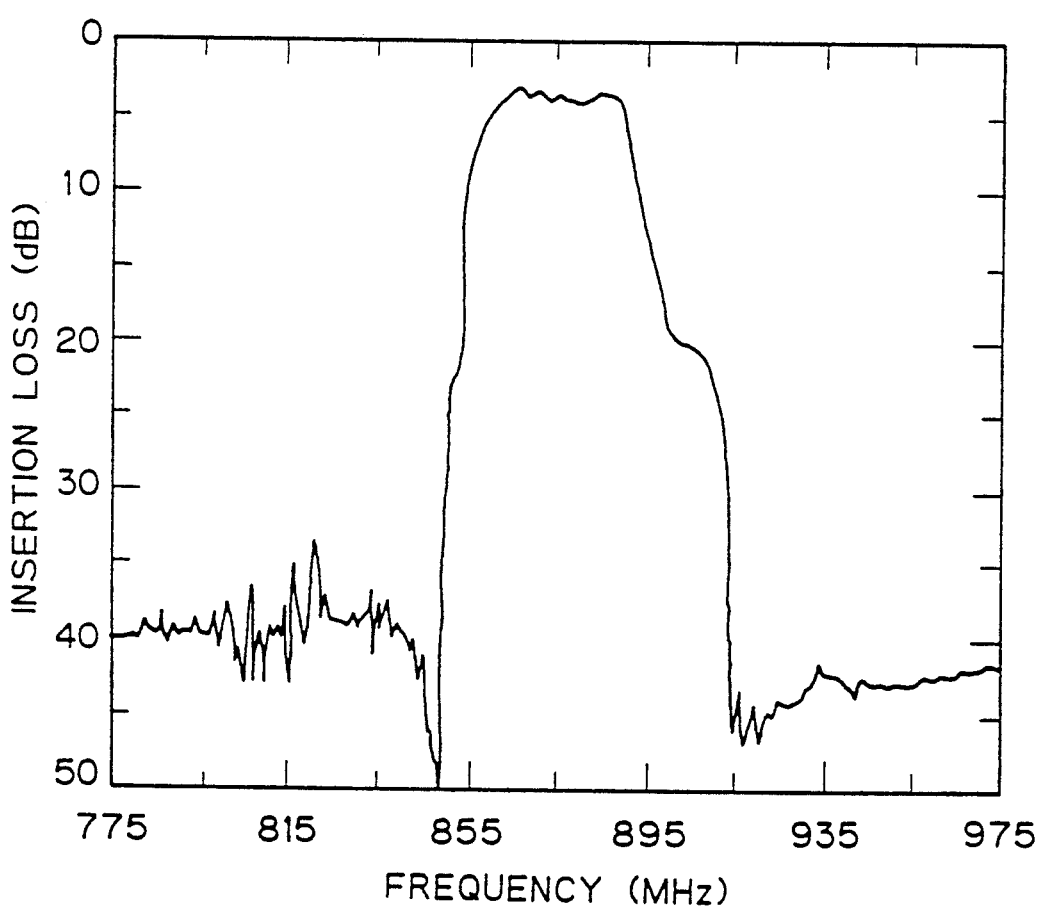
FIG. 7 is a view showing band characteristics of the SAW device shown in FIG. 6.

FIG. 7 shows band characteristics of the SAW device shown in FIG. 6. In FIG. 7, an ordinate represents insertion loss (dB), and an abscissa represents a frequency (MHz).

A piezoelectric substrate used for the sample is a 36° Y-X LiTaO$_3$ single-crystal substrate, and the size of the device is 1.2 mm×2.2 mm with 0.5 mm thick.

An Al-Cu (0.2%) film for forming IDTs is deposited in a vacuum with a thickness of 100 nm. According to a known photolithography technique, a surface acoustic wave filter for an 800 MHz band is formed with an electrode pitch of 2.45 μm, an electrode width of 1.23 μm, and an electrode space of 1.23 μm.

The electrodes are arranged at NA=NA'=NB−1=NB'−1=6 in a 6-input 7-output configuration. The total number of electrodes is S=13. The IDTs A and B are each a normalized type. Note, the number of electrode teeth pairs of the IDT A (1A, 2A, ...) is 22, and that of the IDT B (1B, 2B, ...) is 30. Further, the reflector C (1C, 2C, ...) is a 30-pair open strip reflector.

The device of the present invention described above is packaged in a metal case such as TO-48 (not shown), and its frequency characteristics are measured with a network analyzer. Note, the TO-48 is an example of metal cans used to enclose various electronic elements.

As described above, the SAW device of the first embodiment of the present invention comprises a pair of mirror-symmetrically arranged multiple-electrode surface acoustic wave elements disposed on a piezoelectric substrate. Each of the elements involves a plurality of IDTs A and B alternating with each other. Opposing IDTs B of the pair are connected to each other. The IDTs A of one of the elements form an input end input terminal IN), and the IDTs A of the other element form an output end (output terminal OUT). The number (NA) of the IDTs A is equal to or smaller by one than the number (NB) of the IDTs B.

As shown in FIG. 7, for example, the surface acoustic wave filter (SAW filter) according to the first embodiment of the present invention achieves insertion loss of 3 to 5 dB, i.e., an improvement of about 1 dB compared with the prior art. This sufficiently meets the allowable range of the automobile and portable telephone sets that require a low insertion loss.

Next, characteristics of the SAW devices between the present invention and the prior art will be explained with reference to FIG. 8 and 9.

Figure 8:
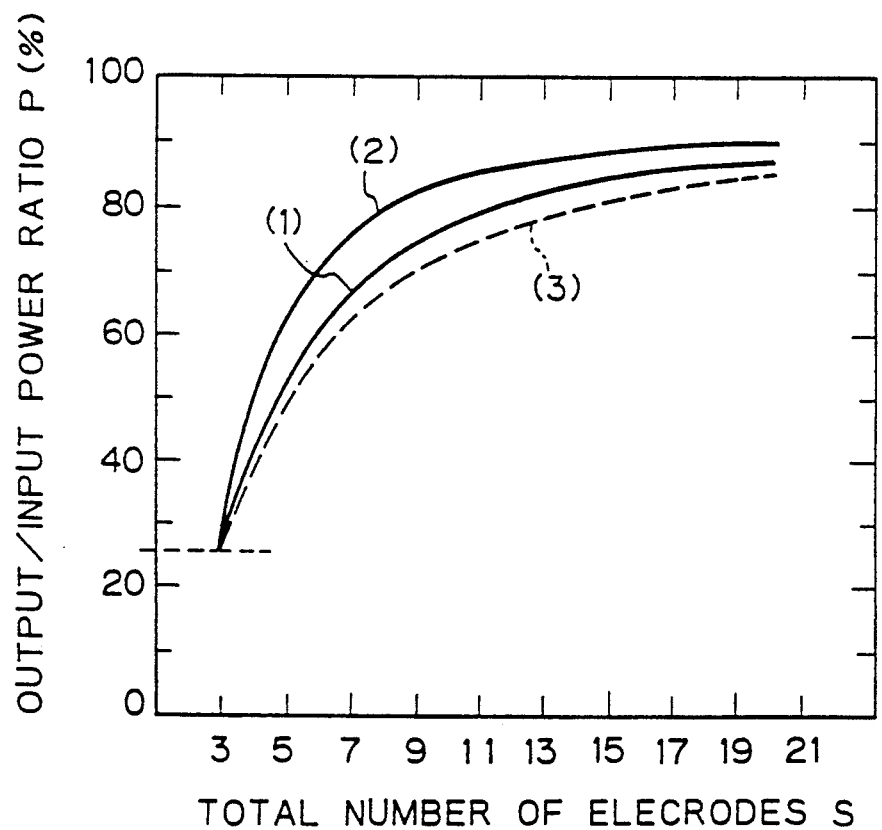
FIG. 8 is a view showing a relationship between the total number of electrodes and an output/input power ratio.
Figure 9:
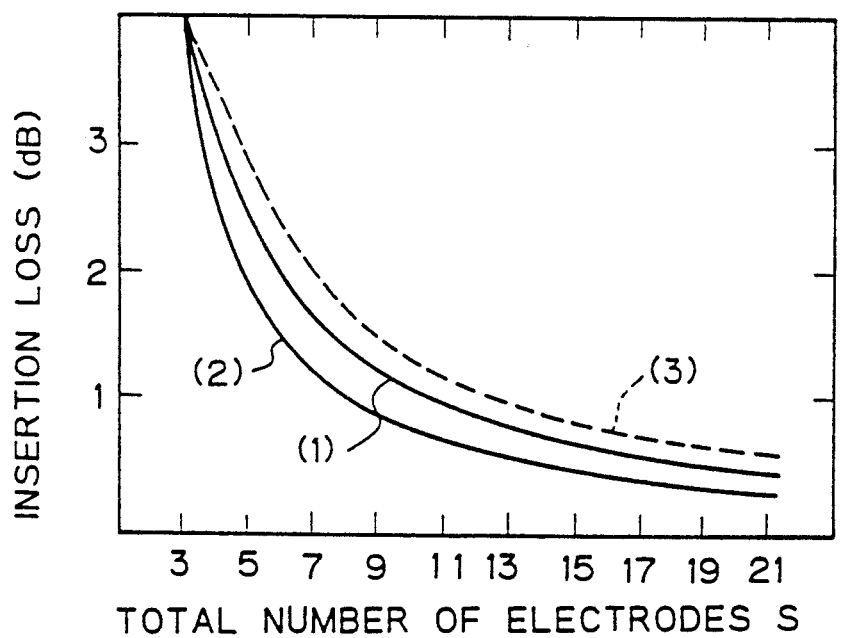
FIG. 9 is a view showing a relationship between the total number of electrodes and insertion loss thereof.

FIG. 8 shows a relationship between the total number of electrodes and an output/input power ratio, and FIG. 9 shows a relationship between the total number of electrodes and insertion loss thereof.

When the number of IDTs A oriented in a surface acoustic wave propagation direction is NA and that of the IDTs B is NB, the arrangement of FIG. 2 will be a 5-input 4-output configuration with NA=5 and NB=4.

Namely, the conventional electrode configuration is expressed as follows:

$$NA=NB+1 \qquad (1)$$

Electro-mechanical energy conversion carried out in each IDT may be understood as a 3-terminal conversion system. When one piece of energy is provided to one of the terminals, the other two terminals convert the energy and each provide ½ of the energy (with reference to N. Sakamoto et al., "Surface Acoustic Wave (SAW) Filter", Electronics Material, p. 120, May, 1988).

For example, in the SAW device shown in FIG. 2, when one piece of electric power is supplied to the upper input terminal IN, the five input IDTs 1A to 5A (input/output electrodes A) receive 1/5 of the electric power, respectively. These IDTs 1A to 5A convert the electric power into surface acoustic waves, and each side of each of the IDTs 1A to 5A emits 1/10 of the electric power. At this time, the surface acoustic waves of 1/10 power emitted from the outer side of the outermost IDTs 1A and 5A are not directly received by the connected IDTs 1B and 1B' and are wasted as a loss. Namely, 2/10 of the power emitted from the left and right sides are wasted.

Note, each side of each connected IDTs 1B to 4B (connected electrodes B) receives the surface acoustic waves of 1/10 power and converts it into electric power and thus each IDT (1B to 4B) then transmits 2/10 of the electric power in total to the connected IDTs 1B' to 4B' in the second row (1').

Thereafter, each side of each connected IDT (1B' to 4B') provides a surface acoustic wave of 1/10 power. Note, each of the outermost IDTs 1A' and 5A' receives the surface acoustic wave only from one side, 1/20 of the power is lost, and only 1/20 of the surface acoustic wave is converted into electric power and transmitted to the output end (output terminal). The other inside output IDTs 2A' to 4A' receive the surface acoustic wave power from both sides thereof, so that each may provide 2/10 of the electric power.

These pieces of power are collected at the output terminal OUT, which finally provides 7/10 of the electric power. The total loss, therefore, will be 3/10 of the electric power. The total power P transmitted from the input terminal IN to the output terminal OUT of a SAW device is expressed with the following general equation (II):

$$P = (2NA - 3) / 2NA \qquad (II)$$

Where, the total number (S) of electrodes $S = NA + NB$ and $NA = NB + 1$ are established, and the equation (II) becomes as follows:

$$P = (S - 2) / (S + 1) \qquad (III)$$

On the other hand, according to the present invention, the number (NA) of the IDTs A is equal to or smaller than the number (NB) of the IDTs B. That is:

$$NA = NB \text{ (with reference to FIG. 5)} \qquad (IV)$$

or $$NA = NB - 1 \text{ (with reference to FIG. 6)} \qquad (V)$$

Electric power provided from the output terminal OUT with respect to one piece of power supplied to the input terminal IN is expressed with the following equations (VI) and (VII):

$$P = (4S - 9) / 4S \qquad (VI)$$

$$P = (2S - 5) / (2S - 2) \qquad (VII)$$

FIG. 8 shows a relationship between the total number of electrodes and an output/input power ratio, which is based on these three equations (III), (VI), and (VII).

In FIG. 8, an ordinate represents an output/input power ratio (P), and an abscissa represents the total number of electrodes (S). Note, similar to FIG. 4, values have been calculated with no regard to a surface acoustic wave propagation loss on a piezoelectric substrate, and the like. Further, in FIG. 8, curves (1) and (2) relate to the present invention, and the curve (1) is for $NA = NB$ and the curve (2) for $NA = NB - 1$. In addition, a dotted curve (3) is the conventional case of $NA = NB + 1$ for comparison purposes.

As shown in FIG. 8, each case of the present invention shows an improvement in the output/input power ratio P compared with the prior art.

FIG. 9 shows a relationship between the total number of electrodes and insertion loss thereof. In FIG. 9, an ordinate represents insertion loss, and an abscissa represents the total number of electrodes. As explained above with reference to FIG. 8, curves (1) and (2) correspond to the present invention, where curve (1) is for $NA = NB$ and curve (2) is for $NA = NB - 1$. Curve (3) corresponds to the conventional case in which $NA = NB + 1$.

When the total number S of electrodes is in a range of from 5 to 13, the present invention reduces the insertion loss less than the prior art by 0.5 to 1 dB. When the total number of electrodes increases beyond a point, the insertion loss reducing effect does not improve in proportion to the increase in the device size. The total number S, therefore, is in practice up to about 13.

Note, the above embodiments are only examples. Without departing from the scope of the present invention, the numbers of electrodes, electrode teeth pairs and reflectors, the material of the electrodes, and the frequency bands may change for optimum designing.

Figure 10:
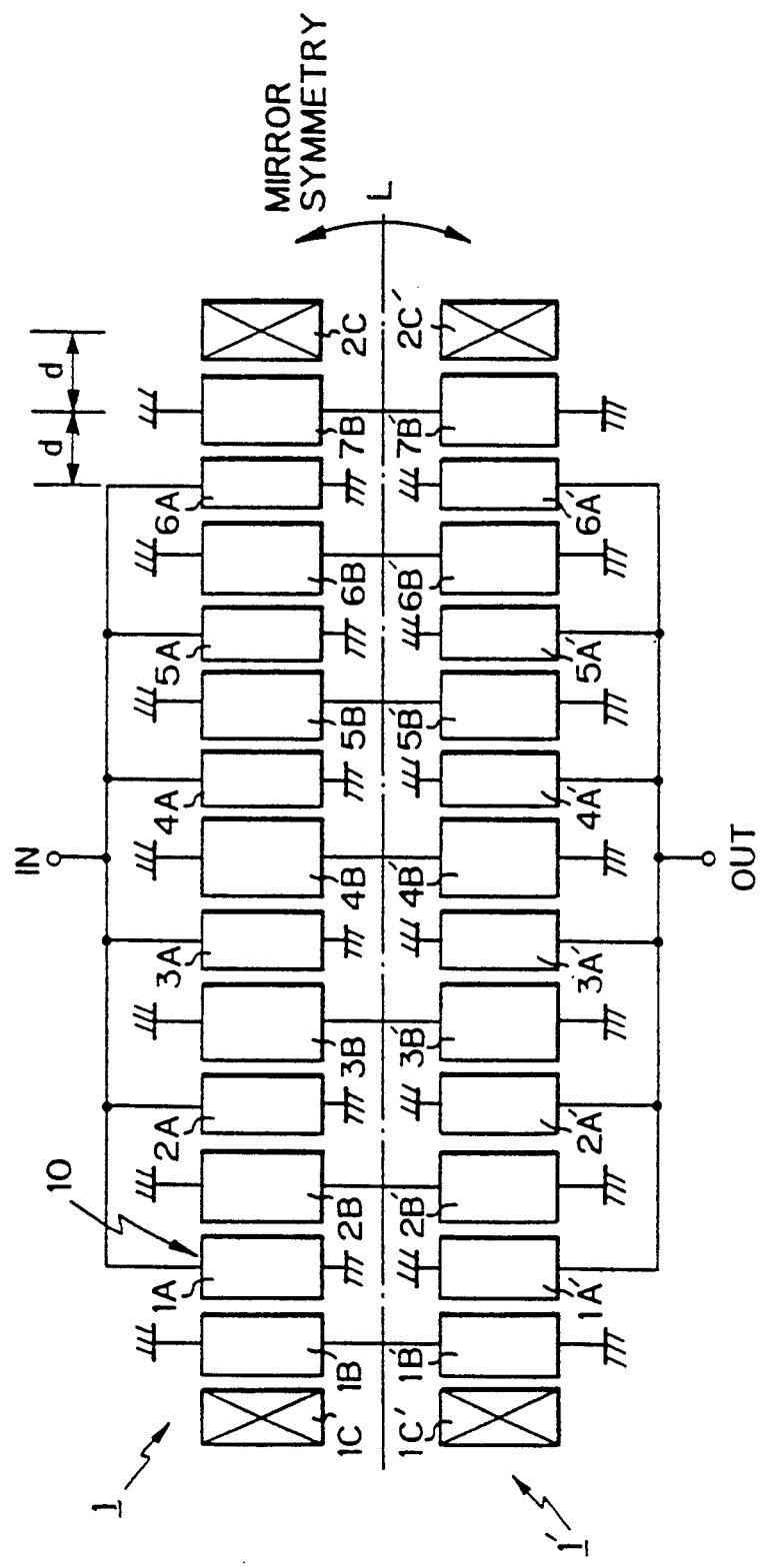
FIG. 10 is a view schematically showing an example of the SAW device according to the related art.

FIG. 10 shows an example of the SAW device according to the related art corresponding to the SAW device shown in FIG. 6, which achieves high attenuation in blocking zones at low loss. Nevertheless, the SAW device is not sufficiently effective in reducing ripples in a band.

As shown in FIG. 10, the SAW device comprises two SAW elements 1 and 1' which are mirror-symmetrically arranged and disposed on a piezoelectric substrate (for example, 36° Y-X LiTaO₃ substrate). The SAW element 1 comprises six input/output electrodes (input IDTs) 1A, 2A, 3A, 4A, 5A, 6A and seven connected electrodes (connected IDTs) 1B, 2B, 3B, 4B, 5B, 6B, and the SAW element 1' comprises six input/output electrodes 1A', 2A', 3A', 4A', 5A', 6A'(output IDTs) and seven connected electrodes 1B', 2B', 3B', 4B', 5B', 6B', 7B' (connected IDTs). Note, the IDT (input/output electrode or connected electrode) is constituted by a plurality of pair electrodes. Also, the input electrodes 1A, 2A, 3A, 4A, 5A, 6A are connected to input terminal IN and output electrodes 1A', 2A', 3A', 4A', 5A', 6A' are connected to output terminal OUT. Input electrode 1A has been labelled unit 10 to explain the details of input electrode 1A with reference to FIG. 11, although it is understood that this explanation applies equally well to the other electrodes of FIG. 10, as discussed in further detail as follows.

Figure 11:
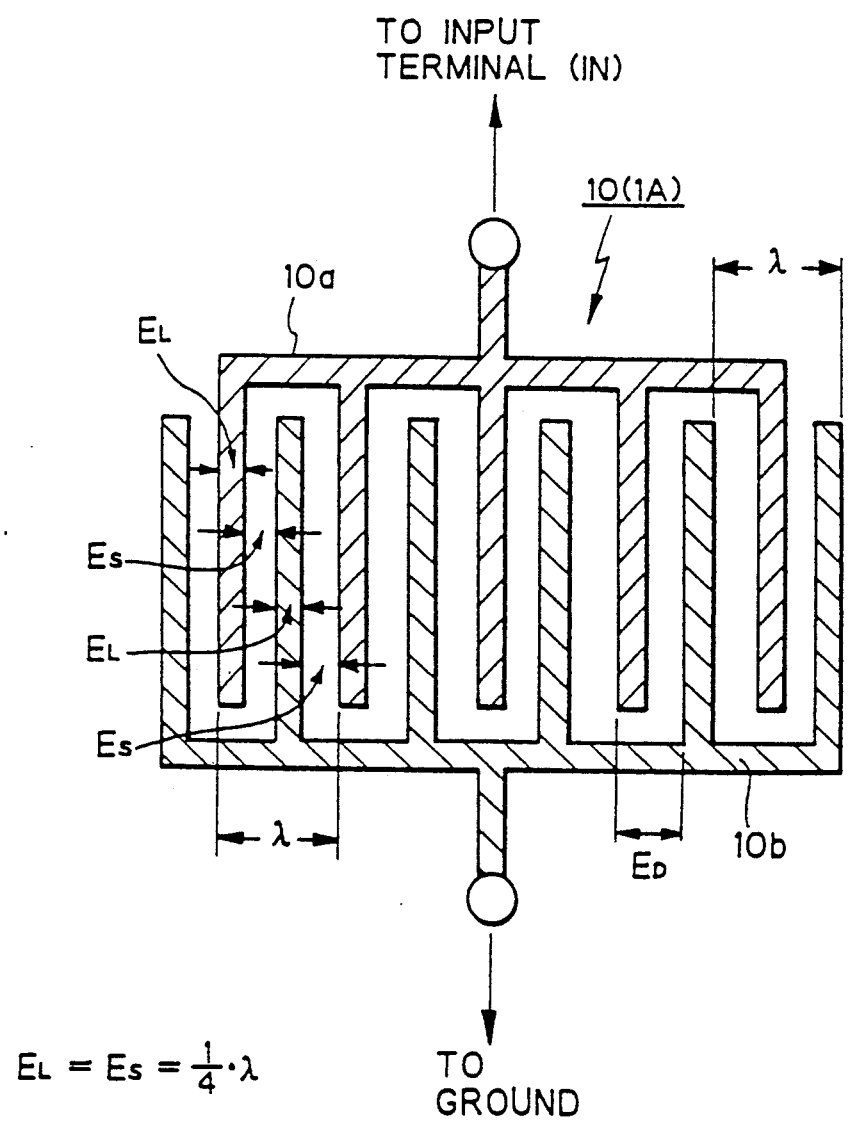
FIG. 11 is a view showing a unit in the SAW device of FIG. 10.

FIG. 11 shows a unit in the SAW device of FIG. 10 As shown in FIG. 11, each unit 10 of the SAW device comprises split-finger (comb) shape patterns 10a, 10b formed from a sputtered aluminum-copper (Al-Cu) film (having a thickness of, for example, 1000 angstroms: Å) on a lithium tantalate (LiTO₃) piezoelectric crystalline material. Note, the LiTO₃ is specified to a 36 rotation Y cut X propagation LiTaO₃ single-crystal substrate (36° Y-X LiTaO₃ substrate), 41° Y-X LiNbO₃ substrate, 64° Y-X LiNbO₃ substrate, and the like.

When the unit 10 is determined to be an input IDT A (1A to 6A), the upper split-finger electrode 10a is connected to an input terminal and the lower split-finger electrode 10b is connected to the grounded, and when the unit 10 is determined to be an input IDT A' (1A' to 6A'), the upper split-finger electrode 10a is connected to the ground and the lower split-finger electrode 10b is connected to an output terminal (not shown). Note, the unit 10 of FIG. 11 is described when the unit 10 is determined to be the input IDT 1A of the SAW device shown in FIG. 10. Further, when the unit 10 is determined to be a connected IDT B (1B to 7B) of the upper SAW element 1, the upper split-finger electrode 10a is connected to the ground and the lower split-finger electrode 10b is connected to an upper electrode (10a) of the corresponding connected IDT B' (1B' to 7B') of the lower SAW element 1', and when the unit 10 is determined to be a connected IDT B' (1B' to 7B') of the lower SAW element 1', the upper split-finger electrode 10a is connected to a lower electrode (10b) of the corresponding connected IDT B (1B to 7B) of the upper SAW element 1, and the lower split-finger electrode 10b is connected to the ground.

As shown in FIG. 11, a tooth width ($E_L$), a space ($E_S$) between teeth (or adjacent fingers), and a teeth pitch ($E_D$) of the IDT (unit 10) are usually designed as $E_L = E_S = \lambda/4$ and $E_D = \lambda/2$, where $\lambda$ is the wavelength of a surface wave. To obtain a center frequency of 835 MHz, for example, $\lambda$ is calculated as 4.9 μm from a sound velocity of 4090 m/sec. for an X-propagation surface wave on the substrate. The pitch $E_D$ of electrode teeth may be 2.45 μm, and the electrode tooth width $E_L$ and space $E_S$ may be 1.23 μm, respectively.

As described above, usually, a pair of input/output IDTs are arranged opposite each other. Automobile and portable telephone sets require surface acoustic wave filters achieving a low loss (for example, insertion loss of 3 to 5 dB or lower), a wide band (for example, a center frequency of 835 MHz or greater and a pass-band width of 25 MHz or greater), and an excellent degree of suppression (for example, an out-of-band attenuation of 24 to 25 dB).

As described above, as shown in FIG. 10, the SAW device comprises six input/output IDTs A (1A to 6A, 1A' to 6A') (each with, for example, 22 pairs of IDT teeth), and seven connected electrodes B (1B—1B' to 7B—7B') (each with, for example, 30 pairs of IDT teeth). Along the outer sides of the connected electrodes (1B—1B', 7B—7B'), there are arranged four reflectors C (1C, 1C', 2C, 2C') for reflecting surface acoustic waves. As is apparent in FIG. 10, the IDTs 1A to 6A, the connected electrodes 1B to 7B, and reflectors 1C and 2C are mirror-symmetrically arranged with respect to the IDTs 1A' to 6A', the connected electrodes 1B' to 7B', and reflectors 1C' and 2C' along a straight line L.

In FIG. 10, a center distance between the input/output IDT A and the connected electrode B, e.g., a center distance d between the input/output IDT 6A (6A') and the connected electrode 7B (7B') is $d = (30 + \frac{1}{4}) \cdot \lambda = 30.25\lambda$. A center distance between the connected electrode B and the reflector C, e.g., a center distance between the connected electrode 7B (7B') and the reflector 2C (2C') is equal to the center distance d between the input/output IDT A and the connected electrode B.

Figure 12:
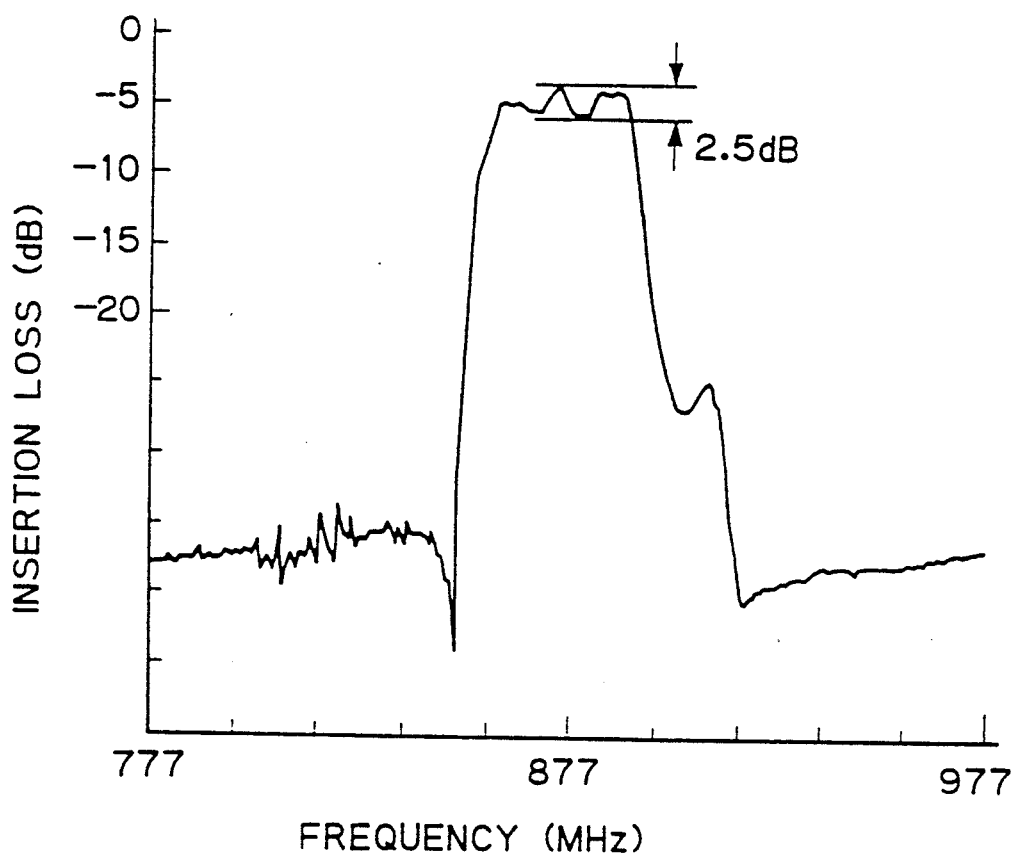
FIG. 12 is a view showing pass-band characteristics of the filter, i.e., the SAW device of FIG. 10.

FIG. 12 shows pass-band characteristics of the filter, i.e., the SAW device of FIG. 10. To clearly show ripples, the pass-band characteristics of the filter (SAW device) are measured without any impedance matching alignment.

As shown in FIG. 12, the pass-band characteristics of the SAW device (filter) of FIG. 10 involve ripples of about 2.5 dB in a pass-band. Such large ripples in the pass-band characteristics of the filter fluctuate gains from channel to channel in a band used for, for example, mobile radio equipment. This is undesirable.

As disclosed in, for example, Japanese Unexamined Patent Publication (Kokai) No. 3-270309, ripples occurring in a band are caused by delayed waves (echo waves). Generally, a multiple-electrode filter (SAW device), which is a subject of the present invention, successively receives delayed waves after a primary response wave.

Figure 13:
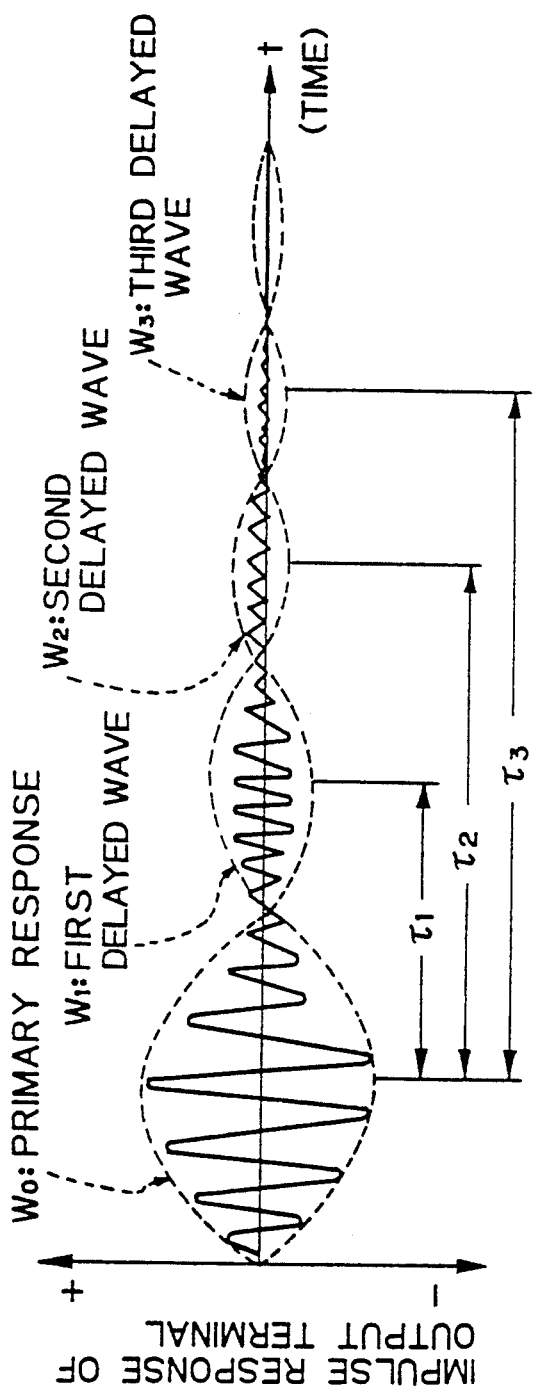
FIG. 13 is a view showing a waveform of impulse response of a SAW device.
Figure 14:
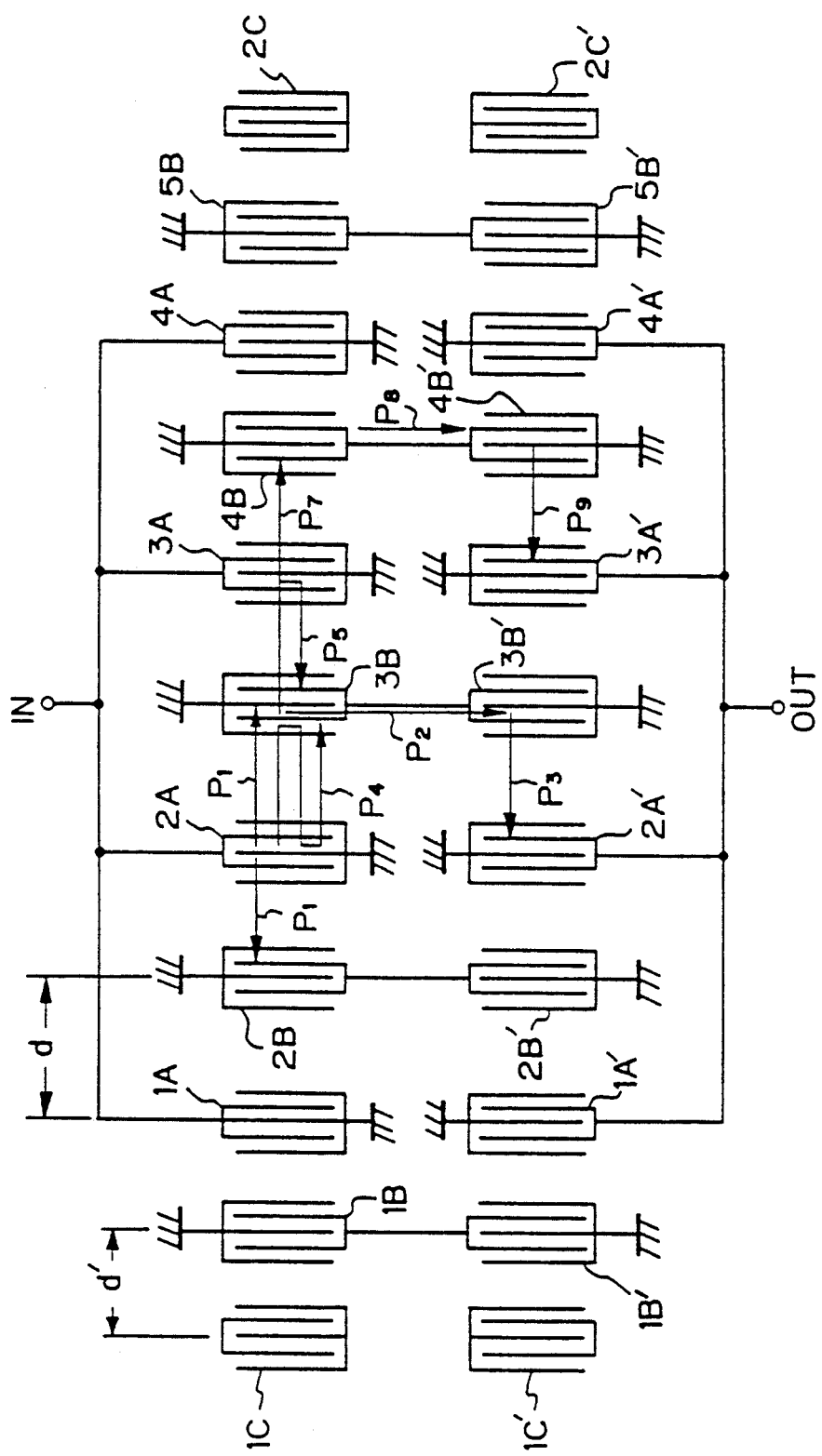
FIG. 14 is a view explaining an impulse response in a SAW device.

FIG. 13 shows a waveform of impulse response of a SAW device, and FIG. 14 shows an impulse response in a SAW device. The SAW device of FIG. 14 includes input electrodes 1A, 2A, 3A, 4A connected to input terminal IN, output electrodes 1A', 2A', 3A', 4A' connected to output terminal OUT, connected electrodes 1B, 1B', 2B, 2B', 3B, 3B', 4B, 4B', 5B, 5B' and reflectors 1C, 1C' and 2C, 2C' which are each separated from input/output elements 1B, 1B' and 5B, 5B' by distance d'.

In FIG. 13, an output terminal OUT of the SAW device of FIG. 14 provides a primary response (wave) $W_0$ and echo waves such as a first delayed wave $W_1$ after a time $\tau_1$, a second delayed wave $W_2$ after a time $\tau_2$, a third delayed wave $W_3$ after a time $\tau_3$, and the like. These echo waves are electric responses appearing at the output terminal OUT of the SAW device shown in FIG. 14, when an impulse voltage is applied to an input terminal IN of the SAW device.

The echo waves $W_1$, $W_2$, $W_3$, ... are produced by the multiple reflection and transmission of surface acoustic waves between IDTs. As shown in FIG. 14, for example, a surface acoustic wave produced by an input IDT (input electrode) 2A is propagated to the left and right. The right one passes along a route $P_1$ and reaches a connected IDT (connected electrode) 3B, which converts the wave into an electric signal. The electric signal passes along a connection route $P_2$ and reaches a connected IDT 3B', which converts the signal into a surface acoustic wave again. Note, the surface acoustic wave is emitted from each side of the input IDT 2A. The wave transmitting along a route $P_3$ through the connected IDT finally reaches an output IDT 2A', so that the output terminal OUT of the SAW device provides an electric signal. This is the shortest response to the impulse and corresponds to the primary response wave $W_0$. Note, there are many routes other than those mentioned above for the primary response (wave). The primary response involves the largest amplitude to provide the primary response wave $W_0$ of FIG. 13.

There are also many routes for the first delayed wave $W_1$. Among them, FIG. 14 shows (1) a route of $P_4 \rightarrow P_2 \rightarrow P_3$ (multiple reflection between the input IDT 2A and the connected IDT 3B), (2) a route of $P_5 \rightarrow P_2 \rightarrow P_3$ (a wave is transmitted through the connected IDT 3B, reflected by an input IDT 3A, returned to the connected IDT 3B, and transmitted from the IDT 3B' to the output IDT 2A'), and (3) a route of $P_7 \rightarrow P_8 \rightarrow P_9$ (a wave is transmitted through the connected IDT 3B and the input IDT 3A, received by a connected IDT 4B, and transmitted from a connected IDT 4B' to an output IDT 3A'). All of them involve the same time delay (for example $\tau_1$). Waves that pass through a first filter along the shortest route (time) and transmit through or are repeatedly reflected by a second filter will become delayed waves involving the same delay. These waves overlap one upon another to form the first delayed wave $W_1$. The amplitude of the first delayed wave $W_1$ is smaller than that of the primary response because of reflection and transmission. The delay time $\tau_1$ is obtained from the following equation:

$$\tau_1 = 2 \cdot d/V \qquad (a)$$
$$= 2 \cdot (n+\beta) \cdot \lambda/V = 2 \cdot (n+\beta) \cdot \tau_0$$

where d is a center distance between the IDTs, V is an average sound velocity for d, n is an integer, $\beta$ is a real number smaller than 1, and $\tau_0$ is a propagation time for intervals of the IDTs, corresponding to a reciprocal of a resonant frequency $f_0$.

Similarly, there are many routes for the second delayed wave $W_2$. The amplitude of this wave is further smaller, and its delay time $\tau_2$ is twice the delay time $\tau_1$. The third and following delayed waves ($W_3, \ldots$) successively appear at intervals of $\tau_1$. Note, usually, these delayed waves are undesirable because they cause ripples in a pass-band, and many efforts have been made to suppress these undesirable waves. Further, Japanese Unexamined Patent Publication (Kokai) No. 3-270309 explains, however, that these undesirable waves can be utilized to extend a band.

Figure 15:
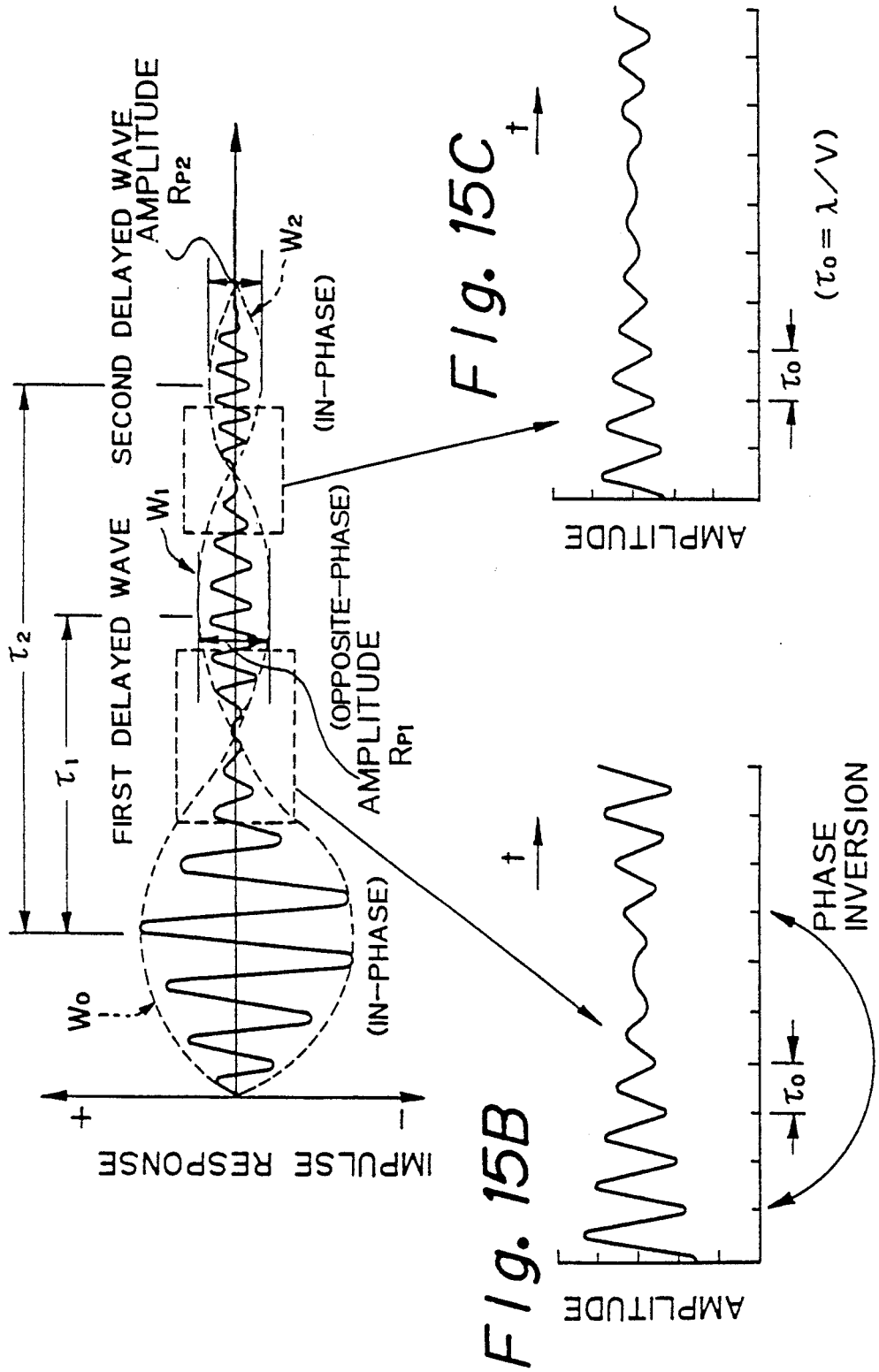
FIGS. 15A to 15C are views showing a relationship between the phase of a primary response wave and those of delayed waves in a SAW device.
Figure 16:
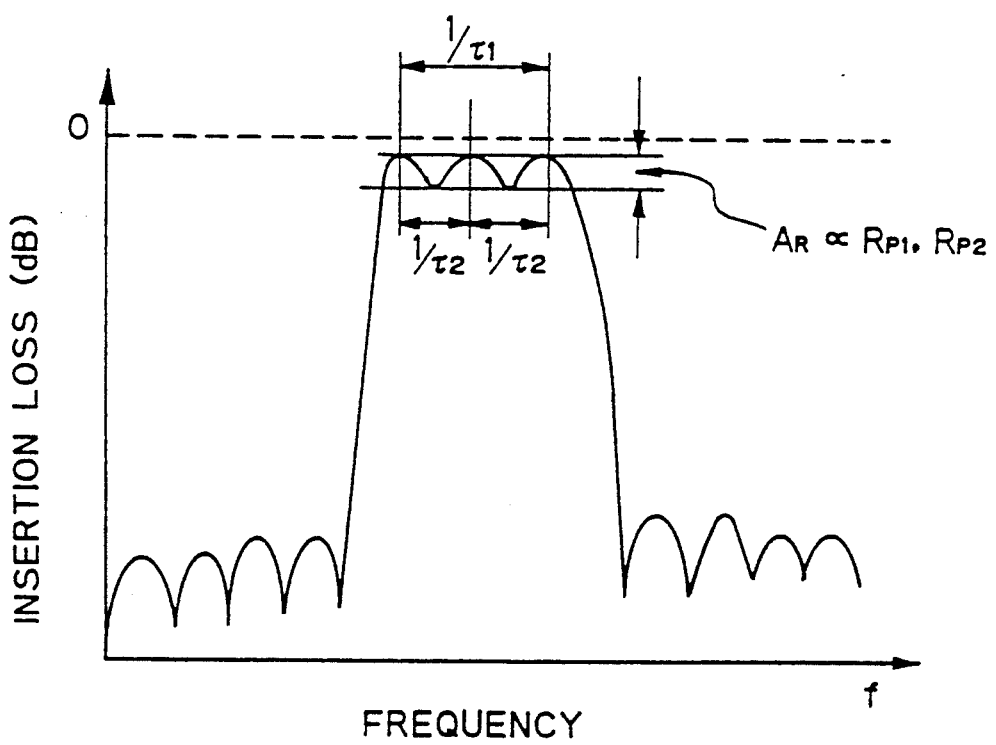
FIG. 16 is a view showing pass-band characteristics after Fourier transformation of the impulse response of FIGS. 15A to 15C.

FIGS. 15A, 15B and 15C show a relationship between the phase of a primary response wave and those of delayed waves in a SAW device, and FIG. 16 shows pass-band characteristics after Fourier transformation of the impulse response of FIGS. 15A, 15B and 15C in which $\tau_1$, $\tau_2$, $R_{P1}$, $R_{P2}$ are the same as previously explained with respect to FIGS. 15A, 15B and 15C. In FIGS. 15B and 15C, $\tau_0$ is the propagation time for intervals of the IDTs. In FIG. 15A, $\tau_1$ is the amount of time between the occurrence of a maximum amplitude of the envelope of the primary response wave $W_0$ and the occurrence of the maximum amplitude $R_{P1}$ of the envelope of the first delayed wave $W_1$. $\tau_2$ is the amount of time between the occurrence of the maximum amplitude of the envelope of the primary response wave $W_0$ and the occurrence of the maximum amplitude $R_{P2}$ of the envelope of the second delayed wave $W_2$.

According to the waveform of FIG. 15A (corresponding to the impulse response waveform of FIG. 13), the phases of the first, third, ... delayed waves $W_1$, $W_3$, ..., i.e., odd order delayed waves are opposite to that of the primary response wave $W_0$ (FIG. 15B), and the phases of even order delayed waves $W_2$, $W_4$, ... are the same as that of the primary response wave $W_0$ (FIG. 15C). Therefore, the filter (SAW device) realizes flat pass-band characteristics as shown in FIG. 16 in which $\tau_1$, $\tau_2$, $R_{P1}$, $R_{P2}$ are the same as previously explained with respect to FIGS. 15A, 15B and 15C. In other words, the variation of insertion loss $A_R$ over the pass-band is relatively small.

Figure 17:
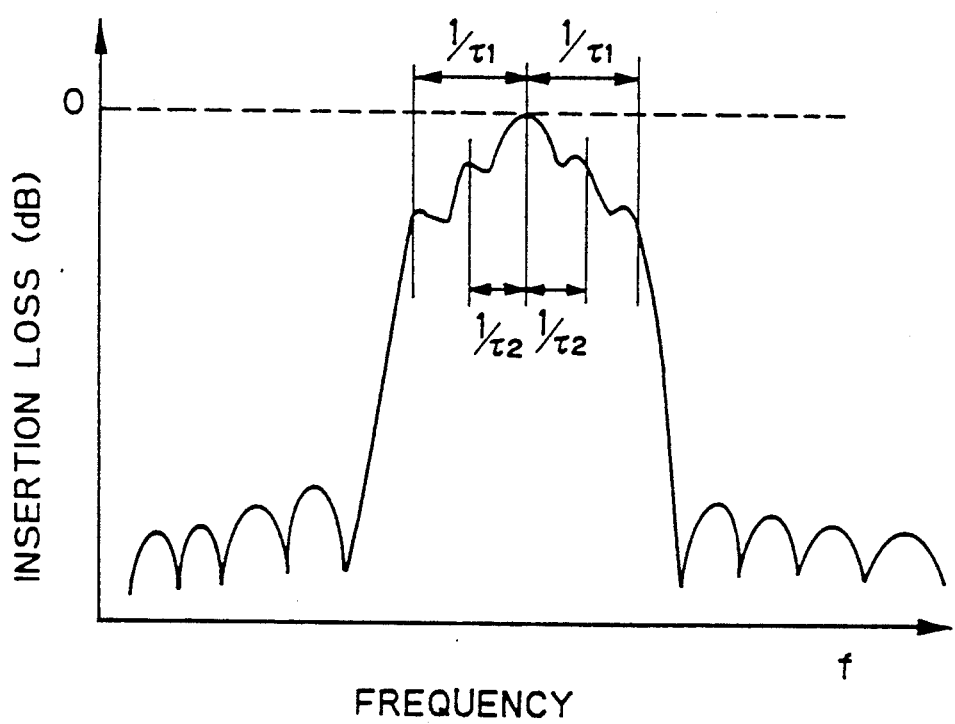
FIG. 17 is a view showing pass-band characteristics of the impulse response of FIGS. 15A to 15C with the phase of the first delayed wave being the same as that of the primary response wave.

FIG. 17 shows pass-band characteristics of the impulse response of FIGS. 15A, 15B and 15C with the phase of the first delayed wave being the same as that of the primary response wave.

When the phases of the odd order delayed waves $W_1$, $W_3$, ... are the same as that of the primary response wave $W_0$, the pass-band characteristics show a mountain-like shape as shown in FIG. 17. Namely, the pass-band characteristics are not flat. To obtain good pass-band characteristics, it is necessary to invert the phases of the odd order delayed waves $W_1$, $W_3$, ... with respect to that of the primary response wave $W_0$. To realize this, a distance d between IDTs must be determined to be $(n+\beta) \cdot \lambda$ (where, $\beta$ is defined from 0.17 to 0.25). Accordingly, a term of $2\beta$ appears for $\tau_1$ in the equation (a), so that, when $\beta$ is $\frac{1}{4}$ (=0.25), a term of $\frac{1}{2}$ (=0.5 $\tau_0$) is added, and the phases of the odd order delayed waves $W_1$, $W_3$, ... become opposite to that of the primary response wave $W_0$. Actually, it has been experimentally confirmed that this effect appears when $\beta$ ranges from 0.17 to 0.25.

As shown in FIG. 16, the pass-band will be flat when the delayed waves involve proper amplitudes (for example, the electric power of the first delayed wave is determined to be about 1/10 that of the primary response) and a proper time delay (for example, a reciprocal of $\tau_1$ is determined to be approximately equal to a required band width). If the amplitudes of the delayed waves are unnecessarily large, undesirable ripples will appear in the flat pass band. It is necessary, therefore, to provide a means for properly controlling the amplitude of the first delayed wave $W_1$. Among the delayed waves (echo waves), the first delayed wave $W_1$ has the largest amplitude, so that it inadvertently influences the pass-band. If the first delayed wave $W_1$ is controllable, the ripples in the band can be reduced to an extent causing no problem in actual use.

Consequently, a delayed wave of the same phase is slightly added to a delayed wave of an opposite phase, to adjust the magnitude (amplitude) of the first delayed wave $W_1$. At this time, adjusting the amplitude of the first delayed wave $W_1$ must not influence the amplitude of the primary response wave $W_0$. If the amplitude of the primary response wave $W_0$ is weakened, insertion loss in a pass-band will increase.

In the SAW device of FIG. 14, the center distance d between the input/output electrode (input/output IDT) A or A' and the connected electrode (connected IDT) B or B' is partly changed as follows:

$$d = n \cdot \lambda, \text{ or } d = (n+\tfrac{1}{2}) \cdot \lambda \qquad (b)$$

Note, this method adds a shift of 0.5 $\lambda$ to part of the primary response (primary response wave $W_0$), thereby weakening the primary response itself. This method, therefore, is not suitable, and it is necessary for the SAW devise to not directly influence the primary response.

A SAW device according to a second embodiment of the present invention will be explained with reference to FIGS. 18 to 21B.

Figure 18:
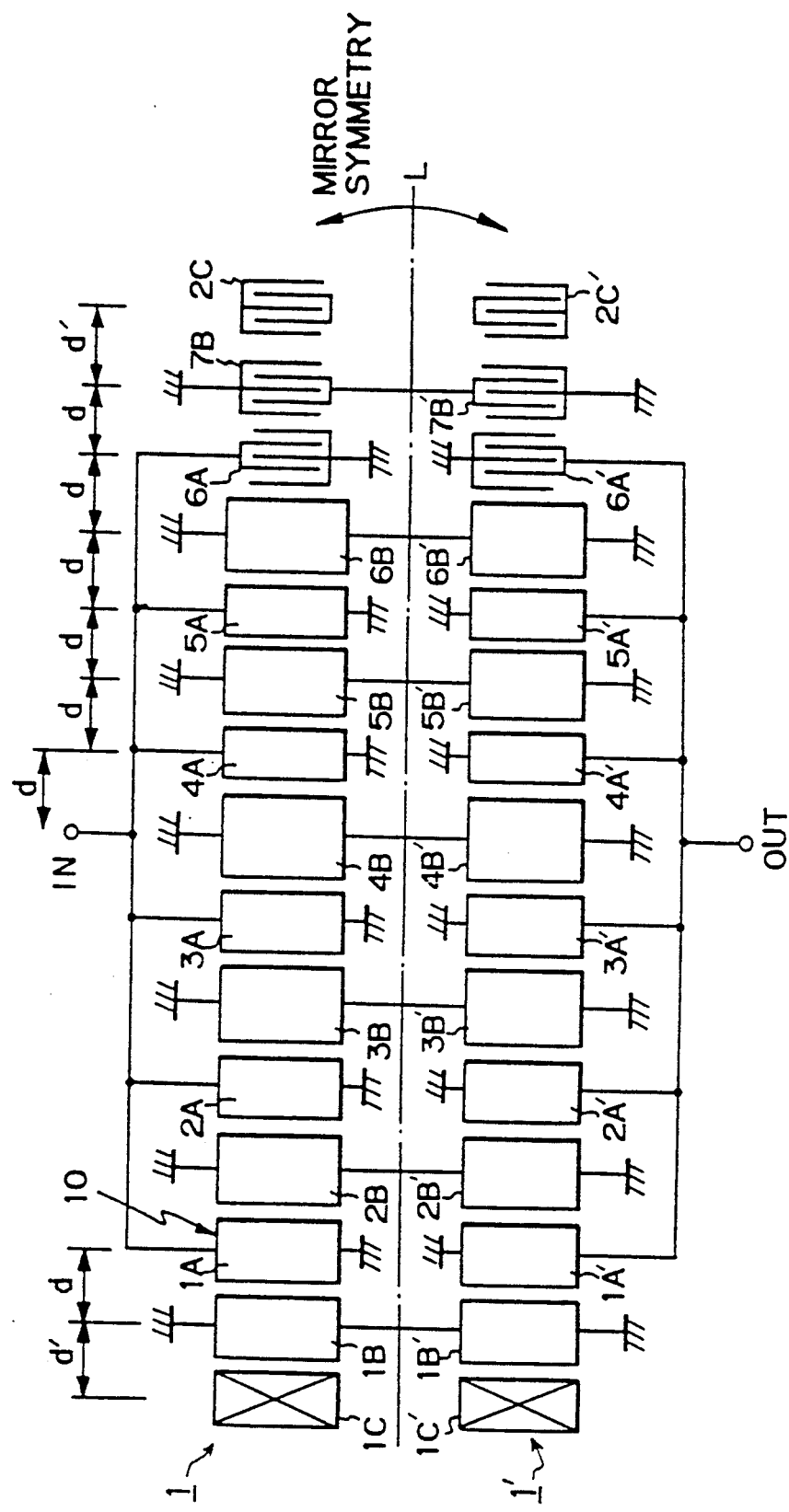
FIG. 18 is a view schematically showing a second embodiment of a SAW device according to the present invention.

FIG. 18 shows a second embodiment of a SAW device according to the present invention. In FIG. 18, similarly labelled elements are the same as those elements described in previous Figures. The SAW device of this embodiment comprises six input/output IDTs A (1A, 2A, 3A, 4A, 5A, 6A; 1A', 2A', 3A', 4A', 5A', 6A'); each having, for example, 22 pairs of split-finger electrodes, comb electrodes, or inter-digital transducers, and seven connected IDTs B (1B—1B', 2B—2B', 3B—3B', 4B—4B', 5B—5B', 6B—6B', 7B—7B') each having, for example, 30 pairs of split-finger electrodes, comb electrodes, or inter-digital transducers.

Further, in the SAW device shown in FIG. 18, along the outer sides of the connected IDTs 1B—1B' and 7B—7B', there are arranged four reflectors C (1C, 1C', 2C, and 2C') for reflecting surface acoustic waves. As shown in FIG. 18, the input IDTs 1A, 2A, 3A, 4A, 5A, 6A, connected IDTS 1B, 2B, 3B, 4B, 5B, 6B 7B, and reflectors 1C and 2C are mirror-symmetrically arranged with respect to the output, IDTS 1A', 2A', 3A', 4A', 5A', 6A' connected IDTs 1B', 2B', 3B', 4B', 5B', 6B', 7B', and reflectors 1C' and 2C' along a straight line L. This arrangement of the SAW device is basically the same as that of the SAW device of the first embodiment (or related art) shown in FIGS. 6 and 10. It is not imperative to arrange the four reflectors along the outer sides of the connected electrodes 1B—1B' and 7B—7B'. For example, only the reflectors 1C and 2C may be arranged along the outer sides of the connected electrodes 1B and 7B. This arrangement also achieves the effect of the embodiment.

Similar to the unit shown in FIG. 11, each of electrode units (IDTs) constituting the SAW device (filter) has a comb pattern (split-finger pattern) formed from a sputtered aluminum-copper (Al-Cu) film (having a thickness of, for example, 1000Å) on a lithium tantalate (LiTO$_3$) piezoelectric single-crystal material. The reflectors C (1C, 1C', 2C, 2C') are each a IDT or a strip electrode. The strip electrode comprises a plurality of straight electrode patterns, and differs from the IDT in that their bases are not commonly connected to one another. The number of pairs of teeth of this IDT is not necessarily the same as that of any one of the input/output IDTs A (1A, 2A, 3A, 4A, 5A, 6A, 1A', 2A', 3A', 4A', 5A', 6A').

As shown in FIG. 18, a center distance between the input/output IDT A and the connected IDT B, e.g., a center distance d between the input/output IDT 6A (6A') and the connected IDT 7B (7B') is determined to be $d=(30+\frac{1}{4})\cdot\lambda=30.25\lambda$. According to the SAW device of this embodiment, a center distance between the connected IDT B and the reflector C, e.g., a center distance d' between the connected IDT 7B (7B') and the reflector 2C (2C') is determined to be $d'=30\lambda$. In this way, each distance d' between the outermost reflectors C (1C, 1C', 2C, 2C') and the adjacent IDTs B (1B, 1B', 7B, 7B') is $d'=n\cdot\lambda$ or $(n+\frac{1}{2})\cdot\lambda$, so that a delayed wave (first delayed wave) is reflected in the same phase without influencing a primary response wave. This distance is not required to be applied for all reflectors but may be properly adjusted depending on the number of electrodes and specifications.

In the SAW device of FIG. 18, the outermost connected electrodes 1B—1B' and 7B—7B' may be removed, and instead, at least one of the reflectors 1C, 1C', 2C, and 2C' may be arranged at a position of $d'=n\cdot\lambda$ or $d'=n/2\cdot\lambda$, to provide the same effect.

Figure 19:
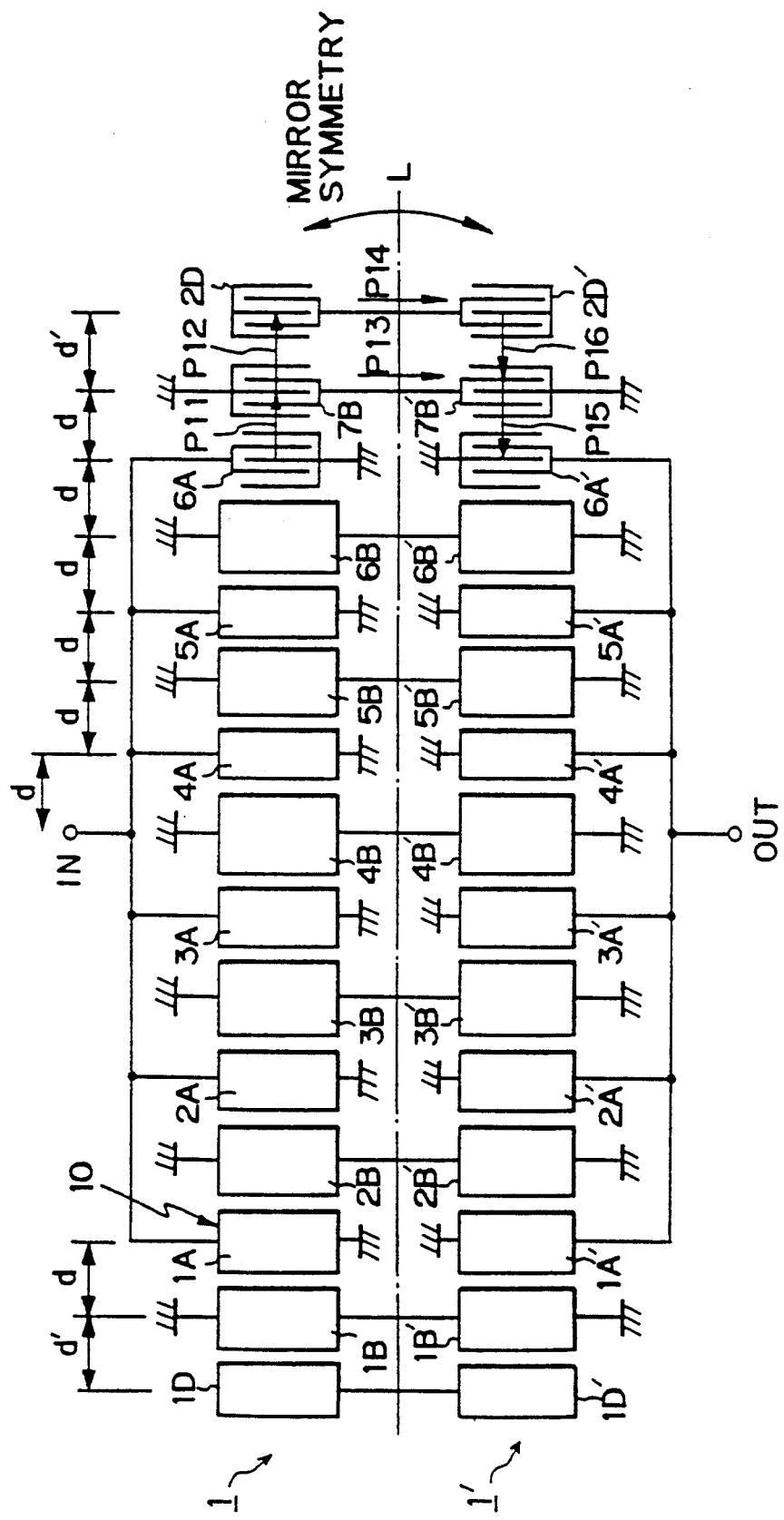
FIG. 19 is a view schematically showing a modification of the second embodiment of the SAW device shown in FIG. 18.

FIG. 19 schematically shows a modification of the second embodiment of the SAW device shown in FIG. 18. As shown in FIG. 19, the SAW device of this modification employs, instead of the reflectors C (1C, 1C', 2C, and 2C') of the SAW device of FIG. 18, connected electrodes D (1D—1D' and 2D—2D'). The connected IDTs electrodes D (1D—1D' and 2D—2D') comprise IDTs each having 16 pairs of split-finger electrodes, comb electrodes, or inter-digital transducers. Note, each center distance d' between the connected IDTs (connected electrodes) 1D—1D' (2D—2D') and the outermost connected IDTs 1B—1B' (7B—7B') is determined to be $d'=30\lambda$. Therefore, as shown in FIG. 19, a primary response is transmitted through a route of $P_{11}\rightarrow P_{13}\rightarrow P_{15}$, and a first delayed wave is transmitted through a route of $P_{11}\rightarrow P_{12}\rightarrow P_{14}\rightarrow P_{16}\rightarrow P_{15}$. Consequently, the delayed wave (the first delayed wave) has the same phase, without influencing the primary response wave, by determining $d'=n\cdot\lambda$ or $(n+\frac{1}{2})\cdot\lambda$. In this case, the connected IDTs D (1D—1D', 2D—2D') are not necessarily arranged at each end but may be properly disposed.

Figure 20A:
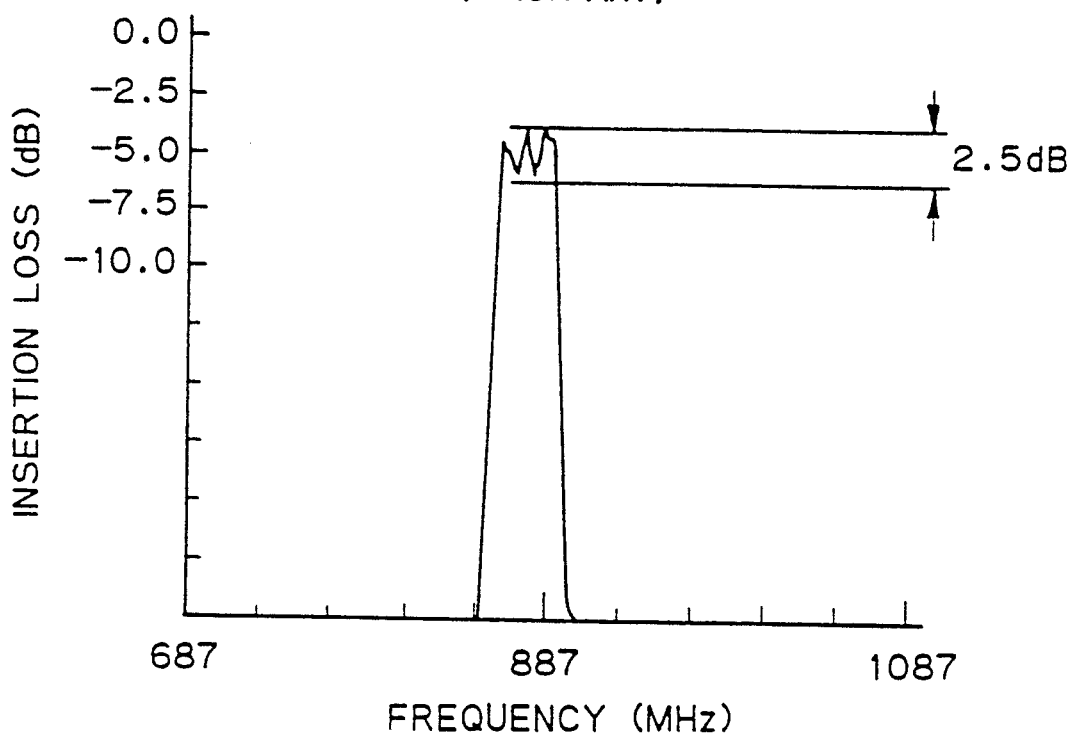
FIGS. 20A and 20B are views showing filter pass-band characteristics of SAW devices of the present invention and the related art, respectively.
Figure 20B:
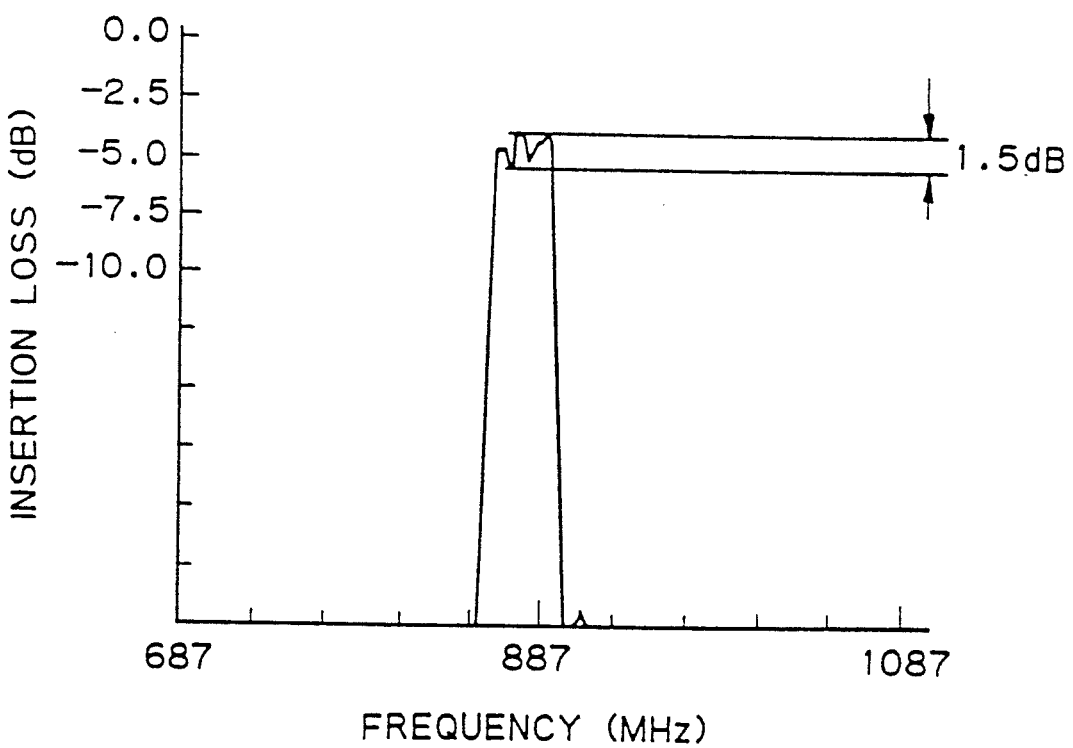

FIGS. 20A and 20B show filter pass-band characteristics of SAW devices of the second embodiment of the present invention and the related art. Note, FIG. 20A shows the pass-band characteristics of the related art SAW device, and FIG. 20B shows those of the present embodiments. For the sake of ripple comparison, characteristics of both figures are measured without any impedance matching alignment. The pass-band characteristics of FIG. 20B are applicable to both embodiments of FIGS. 18 and 19.

By comparing the filter pass-band characteristics between FIGS. 20A and 20B, it is apparent that a ripple of 2.5 dB of the related art is reduced to about 1.5 dB by the present embodiments.

Figure 21A:
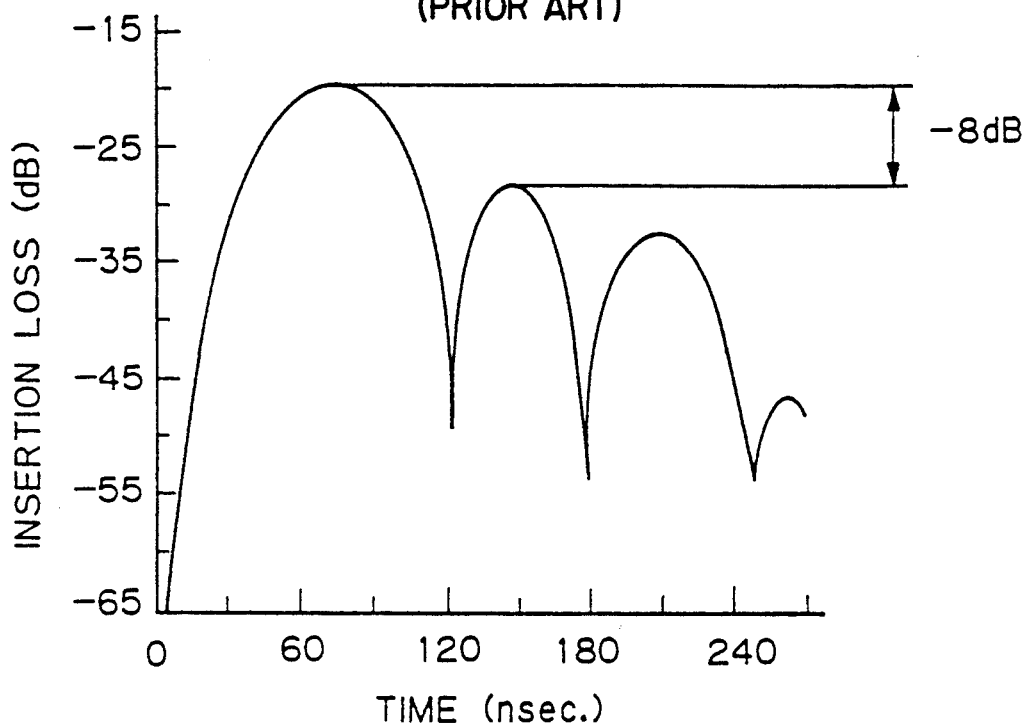
FIGS. 21A and 21B are views showing impulse responses based on the filter characteristics of the SAW devices of the present invention and the related art, respectively.
Figure 21B:
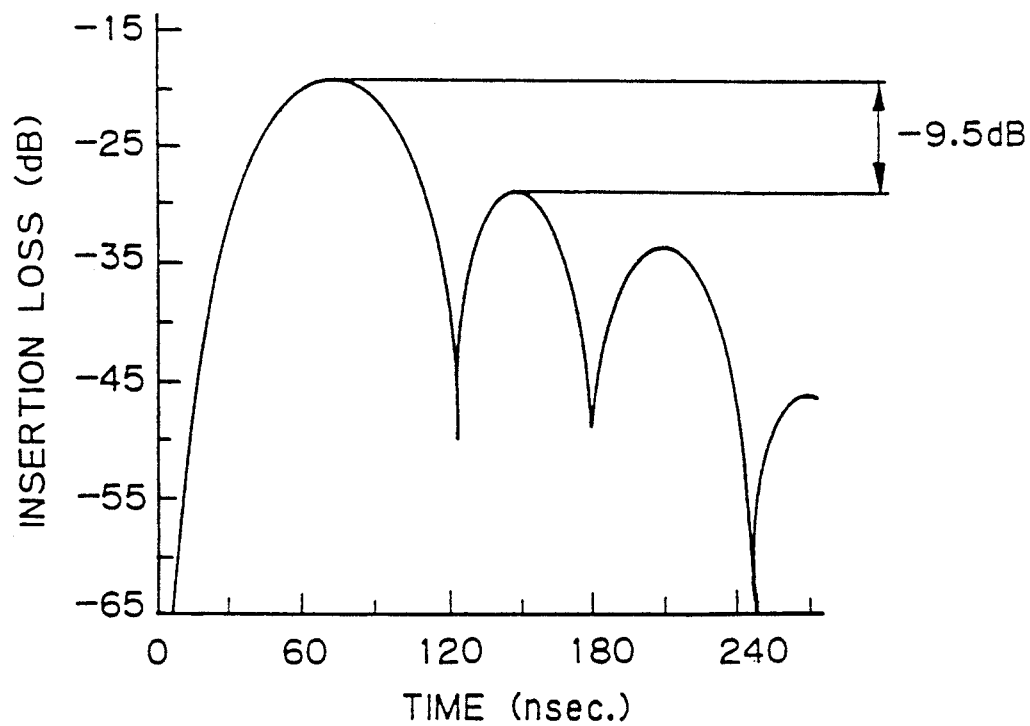

FIGS. 21A and 21B show impulse responses based on the filter characteristics of the SAW devices of the present invention and the related art. Note, FIG. 21A shows the impulse characteristics of the related art SAW device, and FIG. 21B shows those of the present embodiments. Further, FIGS. 21A and 21B show results of inverse Fourier transform carried out on the pass-band characteristics, and a response (an impulse response) is shown on a time axis. In addition, the response amplitude of each of them is obtained according to a common logarithm value of the power (square of an amplitude) of the wave.

By comparing the filter characteristics between FIGS. 21A and 21B, it is apparent that a relative electric power of −8 dB between the first delayed wave ($W_1$) and the primary response (primary response wave $W_0$) of the prior art is suppressed to −9.5 dB according to the embodiments of the invention.

In this way, the embodiments can adjust the electric power of the first delayed wave relative to the primary response, so that the first delayed wave may have an opposite phase of proper magnitude. As a result, the embodiments can suppress ripples in a pass-band and provide flat pass-band characteristics.

Figure 22:
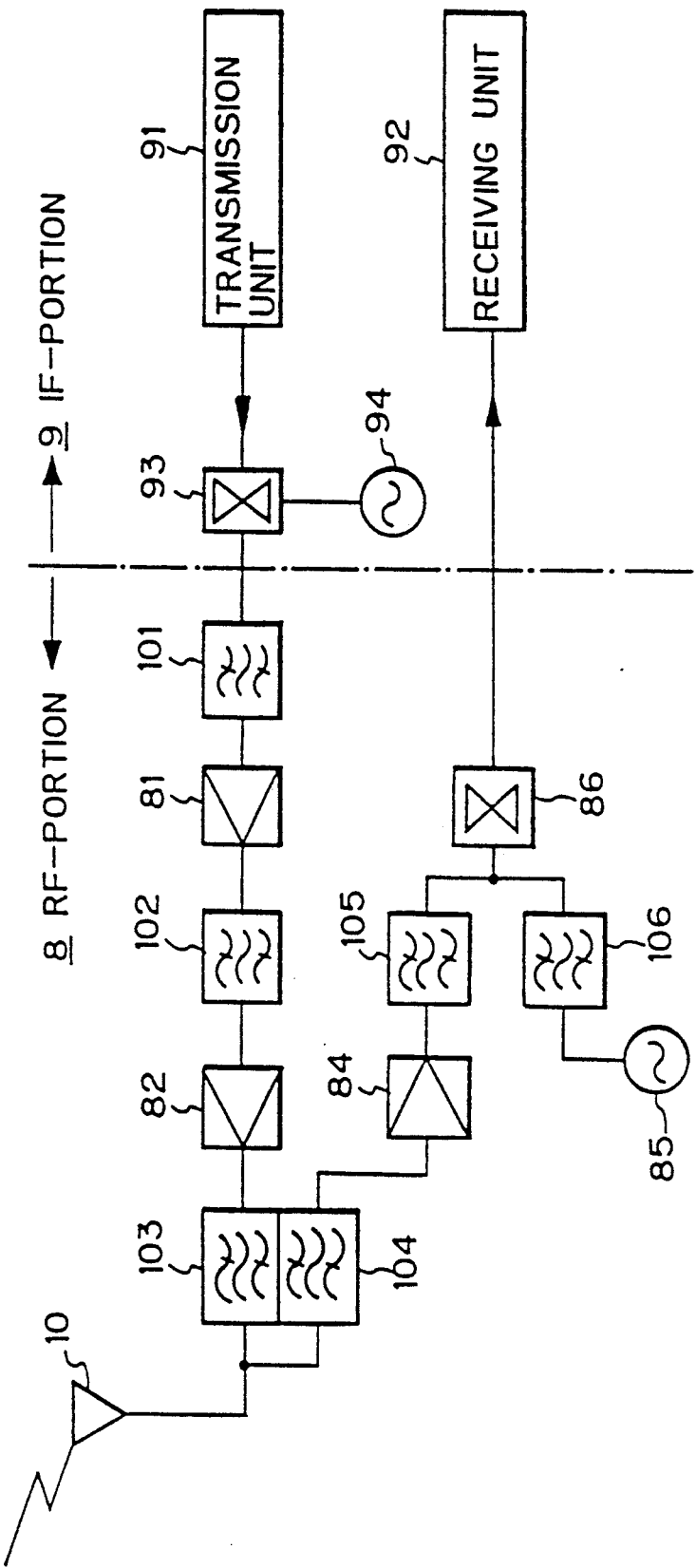
FIG. 22 is a view showing an example of mobile radio equipment using SAW devices.

FIG. 22 is a view showing an example of mobile radio equipment using SAW devices. Namely, FIG. 22 roughly shows RF (radio frequency) portion and IF (intermediate frequency) portion of an example of a mobile telephone transceiver using SAW filters.

As shown in FIG. 22, the mobile telephone transceiver comprises an RF-portion 8, IF-portion 9, and antenna 10. The RF-portion 8 includes a plurality of SAW filters 101 to 106, amplifiers 81, 82 and 84, a mixer 86, and an oscillator (local oscillator) 85. The IF-portion 9 includes a transmission unit 91, a receiving unit 92, a mixer 93, and an oscillator (local oscillator) 94. Note, the SAW devices of the embodiments according to the present invention can be applied to the SAW filters 101 to 106 of the RF-portion 8 in the mobile telephone transceiver. Note, as described above, a low insertion loss, a wide band, and an excellent degree of suppression are required for the SAW filters 101 to 106. Further, the SAW devices according to the present invention are not only used for RF circuit integrations of communication equipment such as mobile telephone transceivers, but also used for cable TV repeaters and converters, and the like.

As explained above, the present invention can reduce the insertion loss of a cascaded multistage surface acoustic wave device such as a surface acoustic wave filter without increasing the size of the device, unlike the prior art that adversely affects the insertion loss in proportion to a improvement in the characteristics in a blocking zone of the device. The invention, therefore, greatly contributes to an improvement of performance of the SAW device. Further, according to a SAW device of the present invention, a center distance d' between an outermost connected electrode and a reflector disposed along the outer side of the connected electrode is d'=30λ, to suppress ripples and realize predetermined pass-band characteristics for a broad band.

Many different embodiments of the present invention may be constructed without departing from the spirit and scope of the present invention, and it should be understood that the present invention is not limited to the specific embodiments described in this specification, except as defined in the appended claims.

We claim:

1. A surface acoustic wave device comprising:
   an input terminal;
   an output terminal;
   a first multiple-electrode surface acoustic wave element including a plurality of first inter-digital transducers and second inter-digital transducers arranged in alternation on a piezoelectric substrate, said first inter-digital transducers being connected to said input terminal; and
   a second multiple-electrode surface acoustic wave element including a plurality of third inter-digital transducers and fourth inter-digital transducers arranged in alternation, said first and second multiple-electrode surface acoustic wave elements being mirror-symmetrically arranged about an axis of symmetry and disposed on the piezoelectric substrate, said third inter-digital transducers being connected to said output terminal, and said fourth inter-digital transducers being connected to corresponding second inter-digital transducers,
   at least one of
   a number of said first inter-digital transducers being equal to or smaller by one, than at least one of a number of said second and fourth inter-digital transducers, and
   a number of said third inter-digital transducers being equal to or smaller by one, than at least one of the number of said second and fourth inter-digital transducers.

2. A surface acoustic wave device as claimed in claim 1, wherein said surface acoustic wave device is supplied with an electric signal at said input terminal which is converted by the first and second multiple-electrode surface acoustic wave elements into surface acoustic waves propagating in the piezoelectric substrate, further comprising:
   at least one reflector which is capable of reflecting said surface acoustic waves, disposed in proximity to an end one of said first and third inter-digital transducers, a center distance d between at least one of said first and second inter-digital transducers and said third and fourth inter-digital transducers being a value $d=(n+\beta)\cdot\lambda$, where λ is defined as an interval between adjacent teeth associated with each inter-digital transducer, n is a predetermined integer, and β ranges from 0.17 to 0.25, and a center distance d' between said reflector and the end one of said first and third inter-digital transducers being one of values $d'=n\cdot\lambda$ and $d'=(n+\frac{1}{2})\cdot\lambda$.

3. A surface acoustic wave device as claimed in claim 2, wherein said reflector includes at least one of inter-digital transducers and strip electrodes.

4. A surface acoustic wave device as claimed in claim 1, wherein said surface acoustic wave device further comprises at least one fifth inter-digital transducer being disposed in proximity to an end one of the second inter-digital transducers, and at least one sixth inter-digital transducer being disposed in proximity to an end one of the fourth inter-digital transducers, a center distance between at least one of said fifth and sixth inter-digital transducers and at least one of said second and fourth inter-digital transducers being one of values $d'=n\cdot\lambda$ and $d'=(n+\frac{1}{2})\cdot\lambda$.

5. A surface acoustic wave device as claimed in claim 4, wherein said fifth inter-digital transducer and said sixth inter-digital transducer are connected to each other to form connected electrodes.

6. A surface acoustic wave (SAW) device supplied with an input signal, comprising:
   a piezoelectric substrate;
   a first conductive line disposed on the piezoelectric substrate and receiving the input signal;
   a second conductive line disposed on the piezoelectric substrate;
   third conductive lines disposed on the piezoelectric substrate;
   a first multiple-electrode SAW element having first and second inter-digital transducers (IDTs) disposed in alternation in a first row on the piezoelectric substrate, the first IDTs being electrically coupled to the first conductive line to receiving the input signal and the second IDTs being acoustically coupled by the piezoelectric substrate to the first IDTs;
   a second multiple-electrode SAW element mirror-symmetrically arranged about an axis of symmetry on the piezoelectric substrate relative to the first SAW element, having third and fourth IDTs disposed in alternation in a second row on the piezoelectric substrate, the fourth IDTs being electrically coupled by the third conductive lines to the second IDTs, the fourth IDTs being acoustically coupled by the piezoelectric substrate to the third IDTs, and the third IDTs being electrically coupled to the second conductive line which outputs an output signal based on the input signal; and
   an end element including one of a reflector and a fifth IDT coupled to a sixth IDT by one of the third conductive lines, disposed on the piezoelectric substrate in proximity to an end of the first and second SAW elements;
   a center distance d between the first and second IDTs and the third and fourth IDTs being $d=(n+\beta)\cdot\lambda$, where λ is defined as an interval between adjacent teeth associated with each IDT, n is a predetermined integer, and β ranges from 0.17 to 0.25, and a center distance d' between the end element and the end of the first and second SAW elements being one of values $d'=n\cdot\lambda$ and $d'=(n+\frac{1}{2})\cdot\lambda$.

7. A surface wave acoustic (SAW) device supplied with an input signal, comprising:
   a piezoelectric substrate;
   a first multiple-electrode SAW element receiving the input signal, being disposed on the piezoelectric substrate and having IDTs disposed on the piezoelectric substrate in a first row;

a second multiple-electrode SAW element being disposed on the piezoelectric substrate, having IDTs arranged on the piezoelectric substrate in a second row, the second multiple-electrode SAW element being electrically coupled to the first multiple-electrode SAW element; and an end element disposed on the piezoelectric substrate in proximity to an end of the first and second multiple-electrode SAW elements, including one of a reflector and a pair of coupled IDTs, a center distance d between the IDTs of the first and second multiple-electrode SAW elements being a value $d=(n+\beta)\cdot\lambda$, where $\lambda$ is defined as an interval between adjacent teeth associated with each IDT, n is a predetermined integer, and $\beta$ ranges from 0.17 to 0.25, and a center distance d' between the end element and the end of the first second multiple-electrode SAW elements being one of values $d'=n\cdot\lambda$ and $d'=(n+\frac{1}{2})\cdot\lambda$.

* * * * *

UNITED STATES PATENT AND TRADEMARK OFFICE
CERTIFICATE OF CORRECTION

PATENT NO. : 5,300,902
DATED : April 5, 1994
INVENTOR(S) : Yoshio SATOH et al.

It is certified that error appears in the above-identified patent and that said Letters Patent is hereby corrected as shown below:

Column 2, line 31, change 31, change "Outermost" to

--outermost--.

Column 4, line 18, after "SAW" delete --)--.

Column 6, line 30, after "end" insert --(--;

line 44, change "FIG." to --FIGS.--;

line 61, change "Other" to --other--.

Column 8, line 56, after "10" insert --.--.

Column 10, line 27, change "$\pi_1$," to --$\tau_1$--;

line 28, change "$\pi_2$" to "$\tau_2$", and change "$\pi_3$" to --$\tau_3$--.

UNITED STATES PATENT AND TRADEMARK OFFICE
CERTIFICATE OF CORRECTION

PATENT NO. : 5,300,902

DATED : April 5, 1994

INVENTOR(S) : Yoshio SATOH et al.

It is certified that error appears in the above-identified patent and that said Letters Patent is hereby corrected as shown below:

Column 12, line 23, change "Waves" to --waves--;

line 47, change "devise" to --device--;

line 57, delete ";".

Column 16, line 32, change "receiving" to

--receive--.

Column 18, line 7, change "first second" to

--first and second--.

Signed and Sealed this

Sixth Day of September, 1994

Attest:

BRUCE LEHMAN

*Attesting Officer*     *Commissioner of Patents and Trademarks*